(12) United States Patent
Kammerer et al.

(10) Patent No.: US 10,466,339 B2
(45) Date of Patent: Nov. 5, 2019

(54) POWER SENSOR FOR INTEGRATED CIRCUITS

(71) Applicant: Infineon Technologies AG, Neubiberg (DE)

(72) Inventors: Jonas Kammerer, Unterhaching (DE); Herbert Knapp, Munich (DE); Hao Li, Poing (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 16/186,938

(22) Filed: Nov. 12, 2018

(65) Prior Publication Data

US 2019/0094337 A1    Mar. 28, 2019

Related U.S. Application Data

(60) Division of application No. 15/252,973, filed on Aug. 31, 2016, now Pat. No. 10,145,938, which is a
(Continued)

(51) Int. Cl.
*G01S 7/40* (2006.01)
*G01R 21/12* (2006.01)
(Continued)

(52) U.S. Cl.
CPC ........ *G01S 7/4008* (2013.01); *G01R 19/0084* (2013.01); *G01R 19/0092* (2013.01);
(Continued)

(58) Field of Classification Search
CPC ............. G01R 19/0092; G01R 19/0084; G01R 19/00; G01R 19/165; G01R 21/00; G01R 21/12; G01S 7/4008
(Continued)

(56) References Cited

U.S. PATENT DOCUMENTS 3,988,928 A    11/1976  Edstrom et al.
4,008,610 A     2/1977  Larsen et al.
(Continued)

FOREIGN PATENT DOCUMENTS

CA    2288660 A1    11/1998
CN    1366616 A     8/2002
(Continued)

OTHER PUBLICATIONS

Muro, Bob. "The Importance of Peak Power Measurements for Radar Systems." Microwave Journal 55.1 (2012): 126-132. APA (Year: 2012).*
(Continued)

*Primary Examiner* — Christopher P McAndrew
(74) *Attorney, Agent, or Firm* — Schiff Hardin LLP

(57) ABSTRACT

An on-chip power sensor and a millimeter-wave communication device (e.g. transmitter or transceiver) on a chip including the on-chip power sensor are described. The millimeter-wave communication device can also include a coupler disposed on a transmit path, the coupler being configured to receive a transmit signal and to provide the transmit signal to an antenna connection (e.g. pad). The on-chip power sensor can be configured to receive a coupled portion of the transmit signal from the coupler, and measure a transmit power of the transmit signal based on the coupled portion of the transmit signal.

19 Claims, 17 Drawing Sheets

Related U.S. Application Data continuation-in-part of application No. 14/262,727, filed on Apr. 26, 2014, now Pat. No. 9,667,357.

(51) Int. Cl.
| | |
|---|---|
| *H04B 17/11* | (2015.01) |
| *G01R 19/00* | (2006.01) |
| *G01R 21/00* | (2006.01) |
| *H04B 17/10* | (2015.01) |
| *H04B 17/12* | (2015.01) |
| *H04B 17/13* | (2015.01) |
| *H04B 17/14* | (2015.01) |

(52) U.S. Cl.
CPC ............ *G01R 21/00* (2013.01); *G01R 21/12* (2013.01); *H04B 17/102* (2015.01); *H04B 17/11* (2015.01); *G01R 19/00* (2013.01); *G01S 2007/4013* (2013.01); *H04B 17/12* (2015.01); *H04B 17/13* (2015.01); *H04B 17/14* (2015.01)

(58) Field of Classification Search
USPC ....................................................... 324/76.11
See application file for complete search history.

(56) References Cited

U.S. PATENT DOCUMENTS

| | | | |
|---|---|---|---|
| 4,835,059 A | 5/1989 | Kodato | |
| 5,204,613 A * | 4/1993 | Cripps | G01R 1/06772 324/119 |
| 5,222,246 A * | 6/1993 | Wolkstein | H03F 3/602 330/107 |
| 5,884,143 A * | 3/1999 | Wolkstein | H03F 1/526 330/107 |
| 6,292,140 B1 | 9/2001 | Osterman | |
| 6,518,743 B1 | 2/2003 | Kodato | |
| 6,625,428 B1 * | 9/2003 | Finnell | G01R 27/06 324/501 |
| 7,061,738 B2 | 6/2006 | Fey et al. | |
| 7,283,921 B2 | 10/2007 | Chandwani et al. | |
| 7,411,552 B2 | 8/2008 | King et al. | |
| 7,548,053 B2 | 6/2009 | Morf et al. | |
| 8,311,760 B2 | 11/2012 | Hohe et al. | |
| 8,803,505 B2 * | 8/2014 | Chizevsky | G01R 35/005 324/601 |
| 2003/0151869 A1 | 8/2003 | Fey et al. | |
| 2007/0105573 A1 * | 5/2007 | Gupta | H04W 72/0406 455/509 |
| 2007/0105576 A1 * | 5/2007 | Gupta | H04W 52/243 455/509 |
| 2007/0138574 A1 | 6/2007 | Eikyu et al. | |
| 2008/0143320 A1 | 6/2008 | Nicholson | |
| 2010/0217556 A1 | 8/2010 | Hohe et al. | |
| 2011/0174978 A1 | 7/2011 | Forg et al. | |
| 2012/0035688 A1 * | 2/2012 | Hancock | A61B 18/18 607/76 |
| 2013/0082687 A1 * | 4/2013 | Chizevsky | G01R 35/005 324/120 |
| 2013/0106440 A1 * | 5/2013 | Brunner | G01R 21/12 324/629 |
| 2013/0281036 A1 * | 10/2013 | Kolokotronis | H01Q 1/246 455/115.1 |
| 2014/0098030 A1 | 4/2014 | Tang | |
| 2015/0309091 A1 * | 10/2015 | Knapp | G01R 21/12 324/76.11 |

FOREIGN PATENT DOCUMENTS

| | | |
|---|---|---|
| DE | 102007047009 A1 | 5/2008 |
| JP | 2003161747 A | 6/2003 |

OTHER PUBLICATIONS

Lee, Jangjoon, et al. "Variation-aware and self-healing design methodology for a system-on-chip." 2012 13th Latin American Test Workshop (LATW). IEEE, 2012.

Strohm, K. M., et al. "Millimeter wave transmitter and receiver circuits on high resistivity silicon." Microwave and Millimetre Wave Monolithic Integrated Circuits, IEE Colloquium on. IET, 1988.

Koh, Kwang-Jin, Jason W. May, and Gabriel M. Rebeiz. "A millimeter-wave (40-45 GHz) 16-element phased-array transmitter in 0.18-m Si Ge 8iCMOS technology." IEEE Journal of Solid-State Circuits 445 (2009): 1498-1509.

Agilent Technologies, "Fundamentals of RF and Microwave Power Measurements (AN 64-1A)", Part No. 5989-6255EN, Revision Date Jun. 1998.

Agilent Technologies, Inc., "Choosing the Right Power Meter and Sensor", 2007,2008 Printed in USA, Feb. 28, 2008.

Institute for Technical Electronics, "Design of Integrated Power Sensors for Microwave", thesis by Christoph Hammer! dated Oct. 31, 2012 (English translated with Google Translate).

Wolf-Dieter Schmidt, Sensorschaltungstechnik (Elekronik 8), Kapitel 4.2, 1 Auflage, Vogel Fachbuch Verlag, Wuerzburg: 1997.

Wursthorn, Jonas, et al. "A True-RMS Integrated Power Sensor for On-Chip Calibration ." Sep. 2014.

Office Action dated Mar. 20, 2017 for Chinese Patent Application No. 201510364015.0.

Muro, Bob. "The Importance of Peak Power Measurements for Radar Systems." Microwave Journal 55.1 (2012): 126-132. APA.

\* cited by examiner

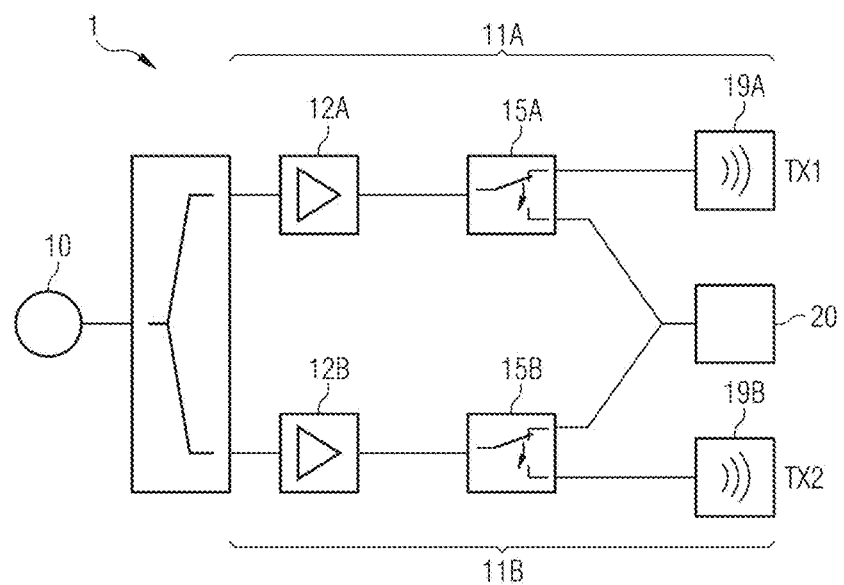

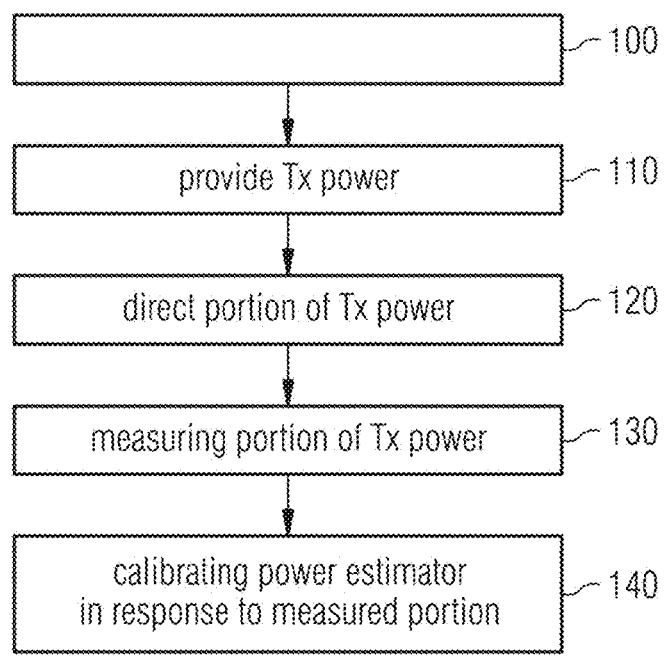

POWER SENSOR FOR INTEGRATED CIRCUITS

CROSS REFERENCE TO RELATED APPLICATIONS

This patent application is a divisional patent application of U.S. patent application Ser. No. 15/252,973, filed Aug. 31, 2016, entitled "POWER SENSOR FOR INTEGRATED CIRCUITS," which is a continuation-in-part of U.S. patent application Ser. No. 14/262,727, filed Apr. 26, 2014, now U.S. Pat. No. 9,667,357, issued May 30, 2017, entitled "MILLIMETER-WAVE TRANSMITTER ON A CHIP, METHOD OF CALIBRATION THEREOF AND MILLIMETER-WAVE POWER SENSOR ON A CHIP," each of which is incorporated herein by reference in its entirety.

BACKGROUND

Field

Embodiments described herein generally relate to a radar transmitter, including a radar transmitter on a chip, a method of calibrating such a radar transmitter and an on-chip power sensor for use in the radar transmitter.

Related Art

U.S. Pat. No. 6,292,140 describes an antenna which is used for the manufacture of bolometer integrated on a silicon chip. The bolometer comprises an opening in the silicon chip, the opening is spanned by two separate thermally isolated structures. A thin-film antenna comprising two parts, is located on the structures with one antenna part on each structure. Radiation received in the larger of the two antenna parts is coupled electromagnetically into the smaller part where it caused a current to flow. A thin-film thermometer measures the temperatures rise of the smaller antenna part, due to the dissipated heat. The bolometer achieves improved performance in comparison to previous bolometer designs because the variation is dissipated in a part of the antenna only and the bolometer is free from impedance-matching constrains of other designs.

US Patent Application Publication No. 2011/0174978 A1 describes a thermal infrared sensor provided in a housing with optics and a chip with thermal elements on a membrane. The membrane spans a frame-shaped support body that is a good heat conductor, and the support body has vertical or approximately vertical balls. The object is to provide a thermal pile infrared sensor in monolithic silicium micro-machining technology, wherein the infrared sensor has a high thermal resolution capacity with a small chip size, a high degree of filling and high response rate. The thermal part sensor structure consists of a few long thermal elements per sensor cell. The thermal elements being arranged on connecting webs that connect together hot contacts on an absorber layer to cold contacts of the thermal elements. A membrane is suspended by one or more connecting webs and has, on both sides of the long thermal elements, narrow slits that separate the connecting webs from both the control region and also the support body.

U.S. Pat. No. 4,008,610 describes a self-balancing D.C.-substitution R.F. power measuring system with first and second high gained differential operational amplifiers, a bolometer element, and a reference resistor element. The amplifiers and the two elements are connected in a current loop with one of the elements connected between the output terminals from the differential amplifiers and the other of the elements connected between center points of isolated dual power supplies associated with each of the amplifiers. Current flows out of one amplifier and into the other. The current is driven to a value which maintains the potential between the input terminus of the first amplifier essential equal to zero and a potential between the input terminals of the second amplifier essentially equal to zero. Thus, the current drives the value of the bolometer elements to a resistance which is equal to the resistance of the reference element.

U.S. Pat. No. 7,548,053 B2 describes a wide-band antenna coupled spectrometer using CMOS transistors. To create a broad band spectrometer, a plurality of individual antenna based bolometers are fabricated on the surface of a single spectrometric chip, each bolometer having an individual antenna which is sized differently from all others, thus being responsive to a generally unique frequency of radiation. Each antenna is coupled to a related transistor, which his easily formed using CMOS technology. The antennas are connected to opposite sides of a transistor gate, thus creating a termination resistor for the particular antenna. Multiple outputs from the various antennas are then coupled, thus providing responsiveness to electromagnetic radiation of a very broad spectrum.

FIG. 1A shows a conventional method of calibrating a millimeter-wave transmitter. On the left-hand side, a transmitting path terminating at an antenna element TX is displayed. The transmit path receives the radio frequency (RF) input from the left, while a directional coupler singles-out a portion of the RF in-power which is directed to a diode. The diode is a rather coarse device for measuring a transmit power. In particular for pulsating RF power a diode typically only responds to maximum amplitudes within such a signal. Hence, the diode will not provide a reliable measure for an average transmit power directed towards the diode. The diode will produce a voltage depending on the maximum amplitude of RF power reaching the diode. A similar millimeter-wave transmitter is illustrated in FIG. 1B. In this example, the directional coupler is connected to two sensitive power detectors (e.g., diodes), one configured for the forward (transmitted) signal and another for the reverse (reflected) signal. Typically the diode (or diodes in FIG. 1B) has a characteristic as displayed in the graph on the right side of FIG. 1A. The voltage Vs across the diode varies with the actual transmit-power TX according to the characteristic shown.

In order to reliably measure the (peak) power reaching the diode, it is typically necessary to measure the transmit-power TX directly and use the voltage Vs to correlate the voltage measured across the diode to the transmit-power actually transmitted at the antenna element terminating the transmit path. When implementing such a calibration of the RF output power in the transmit direction, one may determine the peak RF power delivered to the antenna element by evaluating the voltage Vs of the diode.

A drawback of such a calibrating scheme is that it is rather complex. For example, a signal around 77 GHz needs to be measured with expensive and fragile RF equipment such as probes, wave-guides, power meters, potentially comprising frequency extenders, and the like.

A setup of such a calibration scheme further requires knowledge about RF technology and is rather time consuming. It is further to be understood, that there is no means of recalibrating the diode shown in FIG. 1A or detectors (diodes) shown in FIG. 1B, once the system with the antenna elements is already being used. This is due to the fact, that in the application the actual transmit path is connected to an antenna. For recalibration of the diode-based sensor, the antenna has to be replaced by an RF power meter which is difficult if not impossible for most applications.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

FIG. 2D illustrates a millimeter-wave transmitter according to an exemplary embodiment of the present disclosure.

FIG. 3 illustrates a diagram of a method of calibrating millimeter-wave transmitter according to an exemplary embodiment of the present disclosure.

Figure 1A:
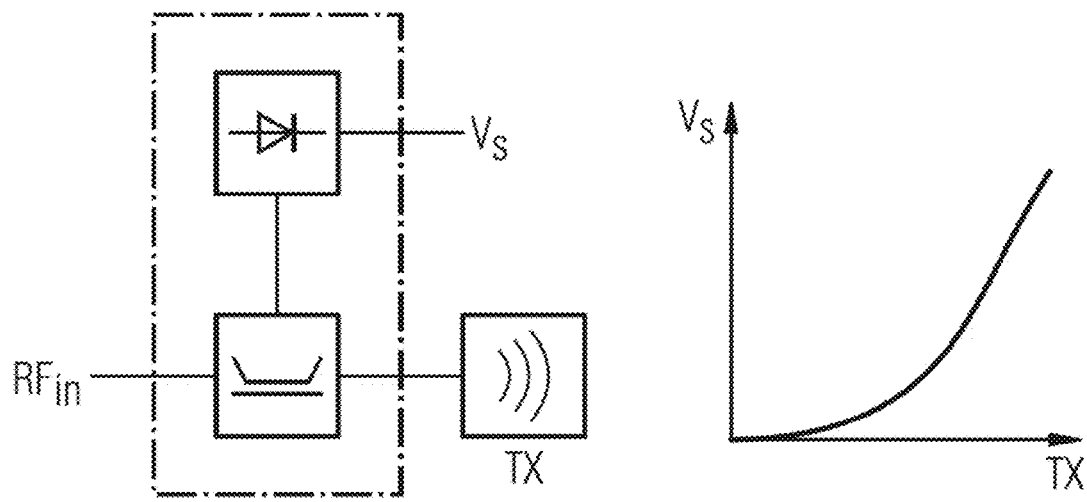
FIGS. 1A and 1B illustrate conventional calibration schemes for millimeter-wave transmitters.

The exemplary embodiments of the present disclosure will be described with reference to the accompanying drawings.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure.

The present disclosure discloses a millimeter-wave transmitter on a chip. The millimeter-wave transmitter according to one embodiment comprises at least one transmit path coupleable to a millimeter-wave transmitter, and an on-chip power sensor. The at least one transmit path may be coupled to the oscillator. The on-chip power sensor is adapted to measure at least a portion of a transmit power transmitted over the at least one transmit path.

The millimeter-wave transmitter according to the present disclosure may without any limitation be part of a millimeter-wave transceiver. Therefore the term millimeter-wave transmitter as used in the following description may be construed as reference to a mere millimeter-wave transmitter or a millimeter-wave transceiver, alike.

Aspects of the millimeter-wave transmitter according to the disclosure may be of interest in the field of radar systems or wireless communication systems, but is not limited thereto.

According to a further embodiment, the on-chip power sensor may be coupled to an individual one of the transmit paths via a directional coupler or via a power splitter.

According to another embodiment the individual one of the at least one transmit path may be terminated by an antenna element or an on-chip termination.

According to yet another embodiment, the individual one of the at least one transmit path comprises an amplifier and/or an on-chip power estimator.

For the millimeter-wave transmitter according to another embodiment the at least one transmit path may comprise an amplifier and/or an on-chip power estimator.

According to a further embodiment the oscillator may be a voltage controlled oscillator.

The millimeter-wave transmitter according to another embodiment may comprise a selected one of the at least one transmit path comprising a switch for selectively coupling the selected one of the at least one transmit path to the on-chip power sensor.

According to yet another embodiment the on-chip power sensor of the millimeter-wave transmitter may be implemented as a layer.

According to yet another embodiment of the millimeter-wave transmitter, the on-chip power sensor may be implemented as a resistor formed on a layer within the chip.

According to yet another embodiment of the millimeter-wave transmitter, the layer may be implemented as a layer forming, for example, one or more transistors, or one or more other electronic devices or circuits as would be understood by one of ordinary skill in the art.

According to yet another embodiment of the millimeter-wave transmitter, the layer may be implemented as, for example, a silicide polysilicon layer used to connect a base region of a plurality of transistors within the chip. In another embodiment, the layer may be implemented as a polysilicon layer (e.g., a silicide polysilicon layer) used to connect a gate region of a plurality of transistors within the chip. The layer is not limited to these implementations, and the layer can be a layer used in forming one or more other electronic devices or circuits as would be understood by one of ordinary skill in the art.

According to yet another embodiment of the millimeter-wave transmitter, the layer may be a layer used to implement base contact layers of transistors within the chip.

According to another embodiment of the millimeter-wave transmitter, the resistor forming the power sensor may be implemented as a temperature dependent resistor.

According to another embodiment of the millimeter-wave transmitter, the oscillator may be a voltage controlled oscillator.

The disclosure further discloses a method of calibrating a millimeter-wave transmitter on a chip. Such a calibration method may be of interest for millimeter-wave transmitters in radar systems or wireless communication systems, alike but is not limited thereto.

The method comprises a step of providing transmit power within at least one transmit path of the millimeter-wave transmitter. The method may further comprise a directing step of directing at least a portion of the provided transmit power to a power sensor on the chip. The method may further comprise a step of measuring the portion of the provided transmit power at the power sensor on the chip.

According to another embodiment the method may comprise a step of calibrating a power estimator within the at least one transmit path in response to the measured portion.

The directing step may according to a further embodiment of the method be such that there are time periods when the portion of the provided transmit power directed to the power sensor substantially vanishes. This is to say that the transmit power may comprise time periods with vanishing amplitude or substantially vanishing amplitude.

The disclosure further discloses an on-chip power sensor coupleable to at least one transmit path of a millimeter-wave transmitter. The on-chip power sensor may comprise a resistor formed in a layer of the chip wherein the resistance of the resistor varies over temperature.

According to yet another embodiment the on-chip power sensor may further comprise a capacity coupled in series to the resistor.

According to yet another embodiment the on-chip power sensor may further comprise a quarter wave-length section and a second capacity coupled to the resistor.

According to yet another embodiment of the on-chip power sensor the resistor may be formed by a material deposited within a layer of the chip.

According to yet another embodiment the layer may comprise at least one base contact of a plurality of transistors within the chip.

Figure 2A:
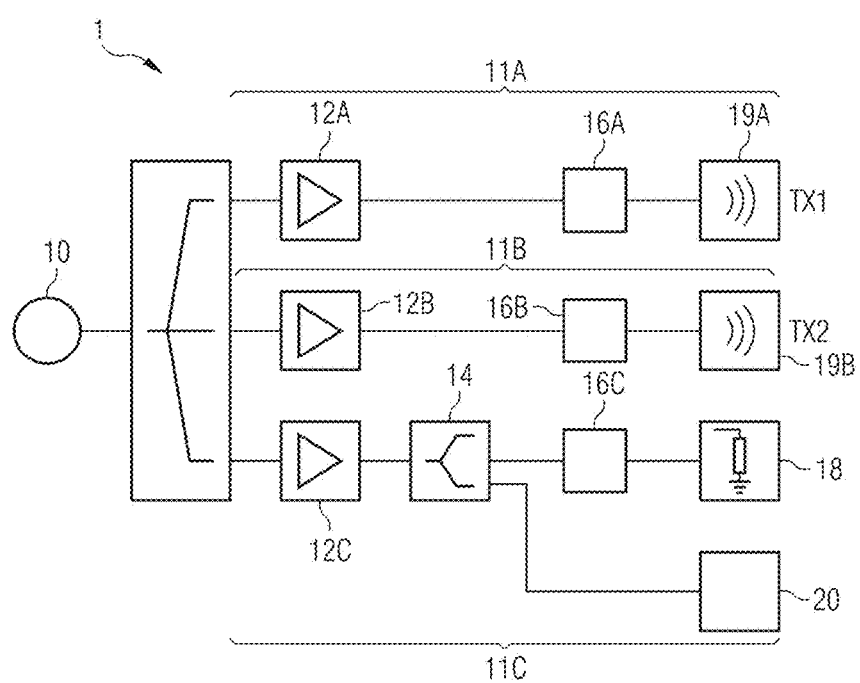
FIG. 2A illustrates a millimeter-wave transmitter according to an exemplary embodiment of the present disclosure.

FIG. 2A shows a first embodiment of the millimeter-wave transmitter according to the disclosure. The millimeter-wave transmitter 1 comprises an oscillator 10, a first transmit path 11A and a second transmit path 11B, together with a calibration path 11C. The oscillator 10 may without limitation be a voltage regulated oscillator. The oscillator 10 may provide millimeter-waves being forwarded to a power divider, which may without a limitation be a 1:n power divider.

The power divider typically provides a defined ratio of incoming power to n-times a fraction thereof at the output side. So the input power provided by the oscillator 10 is typically equally distributed between outputs of the divider. Coupled to each output of the divider there may be the first transmit path 11A, the second transmit path 11B, and a calibration path 11C, which is a variant of the transmit path 11A, 11B. Each of the paths may comprise an amplifier 12A, 12B, 12C, as known in the art. Each of the transmit paths 11A, 11B, and the calibrating path 11C may comprise a power estimator 16A, 16B, 16C. The power estimator 16A, 16B, 16C may typically be implemented as a diode-based estimator. Without limitation other implementations are known to the person skilled in the art. Typically the power estimator 16A, 16B, 16C will only provide a relative and/or coarse measure for the transmit power TX1, TX2 transmitted at respective antenna elements 19A, 19B of the first and second transmit paths 11A, 11B.

However, implementing the power estimator 16A, 16B as the diode-based estimator may have some drawbacks. For example, the power measurement provided by the power estimator 16A, 16B, may only be responsive to maximum power amplitudes forwarded to the power transmitter. Furthermore, individual ones of the power estimator 16A, 16B, 16C, while responding already to the rather low power levels, will vary for each of the individual ones. This is partly due to difficulties of matching the power estimator 16A, 16B, 16C, implemented as a diode to an impedance of the 50. Ohm along the individual transmit path 11A, 11B. Hence, the transmit power in forward direction estimated by the power estimators 16A, 16B, 16C may be considered a representation of the actual transmit power TX1, TX2 delivered to the individual antenna elements 19A, 19B.

Within the calibration path 11C according to the present disclosure, there may be a power splitter 14 present. The power splitter 14 may be implemented as a Wilkinson power splitter, a circulator, also known as a rat race coupler or a directional coupler. A person of ordinary skill in the art will readily appreciate that the power splitter 14 may alternatively or additionally make use of a capacitive coupling. The power splitter 14 may extract a certain portion of the forward transmit power provided downstream the amplifier 12C within the calibration path 11C to an on-chip power sensor 20. Different to the power estimator 16A, 16B, 16C, the on-chip power sensor 20 will respond to a higher RF power range with sufficient sensitivity. Therefore the on-chip power sensor 20 requires the higher RF power range compared to the power estimator 16A, 16B, 16C in order to provide a sufficiently accurate measurement of the RF power directed to the on-chip power sensor 20.

It may therefore be of interest for the power splitter 14 to provide a large enough portion, say as non-limiting example 50% of the total forward transmit power delivered to the calibration path 11C.

As may be seen from FIG. 2A, the calibration path 11C may fork out into the on-chip power sensor 20 in one branch and the on-chip termination 18 in a further branch. The on-chip termination 18 may be of interest in order to provide the required impedance, for example 50Ω, along the calibration path 11C. Providing the on-chip power sensor 20 in combination with on chip termination 18 may be of interest in order to allow for precise transmit power levels to be measured directly.

It may be of interest to implement the on-chip power sensor 20 as a material layer within a stack of layers of the chip. It may be further of interest to implement the on-chip power sensor 20 as a material layer within one of the layers of the chip, for example, as a structured layer of a material. In particular it may be of interest to provide the power sensor 20 as a material layer that is deposited anyway within the named layer of the chip.

Such an implementation of the on-chip power sensor 20 may be of advantage, as no further processing steps will be required in order to implement the on-chip power sensor 20. It may be of interest to use a material for the on-chip power sensor 20 that shows a measureable temperature dependence, say a temperature dependence of a resistance. The temperature dependence may be, for example, described by a positive temperature coefficient or a negative temperature coefficient. Suppose the portion of the transmit power singled out at the power splitter 14 reaches the on-chip power sensor 20. The on-chip power sensor 20 may yield a resistivity value that changes depending on the RF power delivered to the on-chip power sensor 20. As mentioned before the on-chip power sensor 20 may be formed as the temperature dependent resistor implemented as the material layer within the chip.

A person of ordinary skill in the art will readily understand that there will be a certain time required for the on-chip power sensor 20 to be heated-up by the portion of the transmit power and accordingly change its resistivity value which now yields a direct measure of the transmit power forwarded along an individual one of the transmit paths 11A, 11B and the calibration path 11C.

In order to give an estimate for the transmit power TX forwarded along the calibration path 11C, one needs to know the ratio according to which the power splitter 14 divides the forward transmit power TX between the branch terminating at the on-chip termination 18 and the on-chip power sensor 20.

It is to be understood, that in order for the on-chip power sensor 20 to change its resistivity value, a sufficient amount of RF power needs to be forwarded to the on-chip power sensor 20. Consequently, the fraction of transmit power reaching the on-chip termination 18 in FIG. 2A may be substantially lower than the transmit power TX1, TX2 delivered along the first and second transmit paths 11A, 11B.

If one was to implement the on-chip power sensor 20 as the temperature dependent resistor, as explained above, the change in resistance will be a direct measure of transmit power forwarded to the on-chip power sensor 20.

Figure 1B:
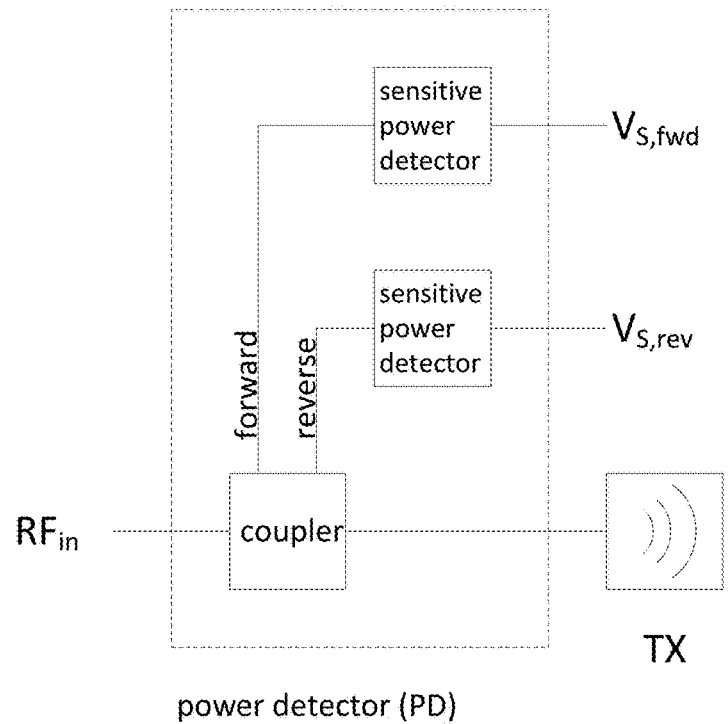

It is once again emphasized that the on-chip power sensor 20 provides a direct measure of the portion of the forward (transmit) power TX3 forwarded along the calibration path 11C on the same chip as the millimeter-wave transmitter 1. Different to the conventional calibration setup shown in FIGS. 1A-1B, there is no coupling or bridging over an air gap required. It is to be noted that the knowledge of the portion of the transmit power forwarded to the on-chip power sensor 20 may be used to calibrate the power estimators 16A, 16B, 16C in order to compensate for variations across individual ones of the power estimator 16A, 16B, 16C, for example implemented as diode-based sensors/estimators.

It is in fact conceivable to improve the estimate provided by the power estimators 16A, 16B, 16C during the operation of the millimeter-wave transmitter 1 with each measurement of the portion of the transmit power within the calibration path 11C.

Figure 2B:
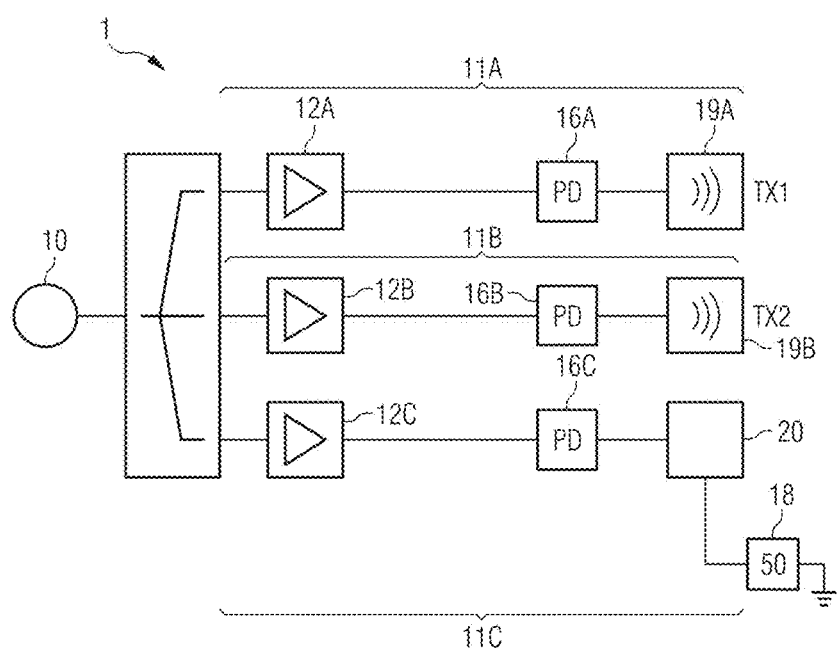
FIG. 2B illustrates a millimeter-wave transmitter according to an exemplary embodiment of the present disclosure.

FIG. 2B shows another embodiment of the millimeter-wave transmitter 1 according to the disclosure. Like elements of the millimeter-wave transmitter 1 shown in FIG. 2B are given identical reference numerals as already explained within FIG. 2A. In FIG. 2B there is no power splitter 14 provided. Instead the amplifier 12C forwards the transmit power to the power estimator 16C and further to the on-chip power sensor 20. The on-chip power sensor 20 is coupled to an on-chip terminator 18 as shown. The on-chip terminator 18 assures that the calibration path 11C is matched to a given impedance (e.g., 50Ω), as are the first and second transmit paths 11A, 11B, typically. The embodiment shown in FIG. 2B may be of interest with regard to an insertion loss of the power splitter 14 being omitted in the embodiment of FIG. 2B.

As before, the on-chip power sensor 20 needs to be provided with a sufficiently high RF power, which seems the case, if the RF power transmitted along individual ones of the transmit paths 11A, 11B and the calibration path 11C is high enough for the on-chip power sensor 20 to respond in a timely manner. Such requirements may be solved by appropriately dimensioning the layer forming the temperature dependent resistor of the on-chip power sensor 20, as explained above. As explained before, each of the power measurements performed with the on-chip power sensor 20 may be used in order to calibrate the individual power estimators 16A, 16B, 16C, as was explained with regard to FIG. 2A.

Figure 2C:
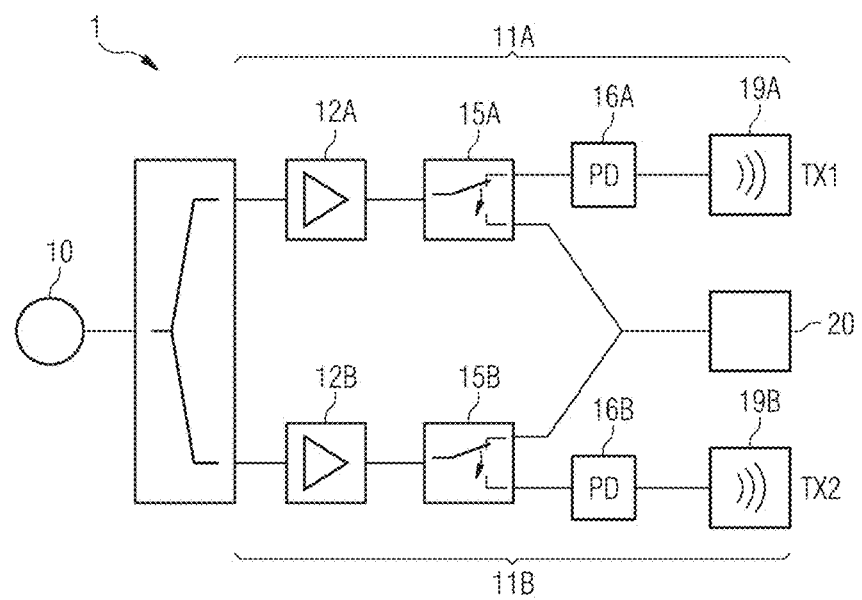
FIG. 2C illustrates a millimeter-wave transmitter according to an exemplary embodiment of the present disclosure.

FIG. 2C shows yet another embodiment of the millimeter-wave transmitter 1 according to the present disclosure. Different to the embodiment discussed with regard to FIGS. 2A and 2B, the RF oscillation delivered by the oscillator 10 in FIG. 2C is split into the transmit paths 11A, 11B. Each of the transmit paths 11A, 11B may comprise an individual amplifier 12A, 12B, an individual power estimator 16A, 16B and an antenna element 19A, 19B terminating each one of the transmit paths 11a, 11B.

Each of the transmit paths 11A, 11B in FIG. 2C may further comprise a switch 15A, 15B. The switch 15A, 15B, may be disposed downstream the amplifier 12A, 12B, respectively. The switches 15A, 15B may forward the transmit power from the respective amplifier 12A, 12B to the on-chip power sensor 20, respectively. Once the transmit power from the first transmit path 11A is measured at the on-chip power sensor 20, this power measure may be used to improve an accuracy of the power estimator 16A within the first transmit path 11A and/or the second power estimator 16B.

Under some circumstances it may be of interest to make sure that only the first switch 15A is in a position to forward the transmit power within the first transmit path 11A to the on-chip power sensor 20, while the second transmit path 11B is in the standard forward transmission mode, this is to say the second switch 15B forwards substantially any of the transmit power within the second transmit path 11B to the antenna element 19B. Once the transmit power from the first transmit path 11A is measured at the on-chip power sensor 20, this power measure may be used to improve an accuracy of the power estimator 16A within the first transmit path 11A and/or the second power estimator 16B within the second transmit path 11B.

Likewise under some circumstances, it may be of interest to have the second switch 15B in a position to forward the transmit power within the second transmit path 11B to the on-chip power sensor 20, while the first transmit path 11A is in the standard forward transmission mode, this is to say the first switch 15A forwards substantially any of the transmit power within the first transmit path 11A to the antenna element 19A. Once the transmit power from the second transmit path 11B is measured at the on-chip power sensor 20, this power measure may be used to improve an accuracy of the power estimator 16B within the second transmit path 11B and/or the first power estimator 16A within the first transmit path 11A.

If however both switches 15A, 15B are in a position so that the respective transmit power from the first transmit path 11A and the second transmit path 11B is forwarded to the on-chip power sensor 20, care needs to be taken that the measured power value at the on-chip power sensor 20 now corresponds to the total transmit power forwarded along the first transmit path 11A and the second transmit path 11B. As before, the transmit power measured at the on-chip power sensor 20 when forwarding the transmit power within the transmit paths 11A, 11B to the on-chip sensor 20, may be used in order to improve an accuracy of the first power estimator 16A within the first transmit path 11A and/or the second power estimator 16B within the second transmit path 11B.

A person of ordinary skill in the art will readily appreciate that the presence of the switches 15A, 15B may provide for a setup wherein the millimeter-wave transmitter 1 transmits its respective transmit power TX1, TX2 to the antenna elements 19A, 19B during a time period wherein the millimeter-wave transmitter 1 is supposed to transmit. During non-transmitting time periods of a corresponding transmission protocol, the switches 15A and/or 15B, may respectively be set to a position, wherein the respective transmit power TX1 and/or TX2 is being forwarded to the on-chip power sensor 20. The respective transmit power determined in such a non-transmitting period may be used in order to improve a calibration of the power estimator(s) 16A, 16B. In non-transmitting time periods the respective transmit power TX1 and/or TX2 may be measured individually or in combination, as explained before. Such a setup of the millimeter-wave transmitter 1 may be of interest when operating the transmitter as an array of transmitting antenna elements 19A, 19B.

Alternatively, the embodiment of FIG. 2C may be used to measure a transmit power TX1 within the transmit path 11A by directing this transmit power to the on-chip power sensor 20, while the second transmit path 11B is transmitting its respective transmit power TX2, by appropriately switching the switches 15A, 15B. Such a setup may however lead to a millimeter-wave transmitter 1 emitting with an individual one of the antenna elements 19A, 19B at a time, which may reduce the overall transmit power.

FIG. 2D shows yet another embodiment of the millimeter-wave transmitter 1. The millimeter-wave transmitter 1 shown in FIG. 2D is slightly different to the millimeter-wave transmitter shown in FIG. 2C, namely the power estimators 16A, 16B are not present within the first transmit path 11A and the second transmit path 11B. It may be sufficient to rely on the on-chip power sensor 20 in order to determine the respective transmit path TX1, TX2, forwarded along the individual transmit paths 11A, 11B. The switches 15A, 15B, shown in the embodiments of the millimeter-wave transmitter 1 of FIGS. 2C and 2D may reach a switching time or rate sufficiently high in order to reliably switch the switches 15A, 15B between periods of transmitting millimeter-wave power and non-transmitting periods according to a protocol the millimeter-wave transmitter 1 is operated with.

FIG. 3 depicts a block diagram of a method of calibrating the millimeter-wave transmitter 1 on a chip according to the present disclosure. The method may comprise a step 110 of providing a transmit power within at least one of the transmit paths 11A, 11B and/or the calibration path 11C. In a step 120 at least a portion of the provided transmit power is directed to the on-chip power sensor 20. The portion of the directed TX power may be determined by the 1:n power splitter downstream the oscillator 10 and/or the power splitter 14 within the calibration path 11C and/or the respective switching position of the switches 15A, 15B, as explained before.

A person of ordinary skill will readily understand that in a set-up of FIGS. 2C and 2D the full transmit power TX1 within the first transmit path 11A and/or the full transmit power TX2 within the second transmit path 11B may be forwarded to the on-chip power sensor 20, if the switches 15A, 15B are set to corresponding switching positions, as was explained above.

The calibration method may further comprise a step 130 of measuring a power of the forwarded portion of the transmit power being forwarded in the directing step 120. The method may further comprise an optional step of calibrating power estimators 16A, 16B, 16C in response to the measured portion of the transmit power.

A person of ordinary skill in the art will readily understand that the directing step 120 may be implemented such that there are time periods wherein substantially the full transmit power within the individual one of the transmit path 11A, and/or 11B is being forwarded to the respective antenna elements 19A, 19B and the millimeter-wave transmitter 1 therefore reaching its full transmit power TX1 and/or TX2 during such time periods. This shall be explained in the context of radar distance measuring systems as a non-limiting example. Similar conditions may exist with protocols used in millimeter-wave transmitters for wireless communication.

In radar distance measuring systems as a non-limiting example, there may be time periods of the radar transmitter 1 sending transmit power TX1 and/or TX2. Subsequently thereto, there may be time periods of receiving an echo or a response during a receiving period. During the receiving period of a corresponding radar receiver (not shown), the transmit power TX1, TX2 may be diverted, preferably completely to the on-chip power sensor 20, in order to calibrate the transmit power TX1, TX2 delivered over the individual transmit paths 11A, 11B.

Alternatively or additionally in the embodiments of FIGS. 2A and 2B the on-chip termination 18 may be replaced by a third antenna element 19C forwarding not the full transmit power TX1, TX2 as first and second transmit path, but a fraction thereof depending on the ratio the power splitter 14 splits the power between the on-chip power sensor 20 and the portion of the calibration path 11C comprising the power estimator 16C. There may be situations, where a further antenna element 19C is of advantage, even though it will not reach the full transmit power as the first and second transmit path 11A, 11B.

Figure 4A:
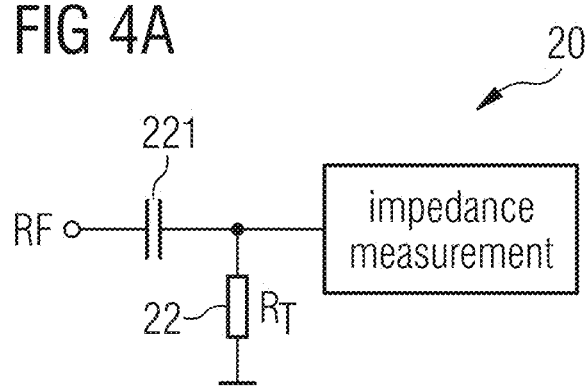
FIG. 4A illustrates an on-chip power sensor according to an exemplary embodiment of the present disclosure.

FIG. 4A shows a first implementation of an on-chip power sensor 20 for use in a millimeter-wave transmitter 1 as the on-chip power sensor 20 according to the disclosure. The on-chip power sensor 20 shown in FIG. 4A may be implemented as a resistor 22 formed in a layer of the chip, the resistance of the resistor 22 varying over temperature. A person of ordinary skill in the art will readily appreciate that normally one is interested in substantially eliminating any temperature dependencies in resistivity for layers within the chip. Nevertheless for the purpose of the on-chip power sensor 20 according to the present disclosure, it may be of interest to provide resistor 22 such that it shows a pronounced temperature dependence of its resistivity, for example a positive temperature dependence or a negative temperature dependence.

In an embodiment as shown in FIG. 4A, radio frequency entering from the left is coupled via a capacitor 221 to the resistor 22. As the capacitor 221 is substantially invisible to the radio frequency, the RF power is forwarded to the temperature dependent resistor 22 and the change in resistivity may be measured by a standard on-chip impedance measurement. The on-chip impedance measurement can include processor circuitry configured to measure the resistivity of the resistor 22.

Figure 4B:
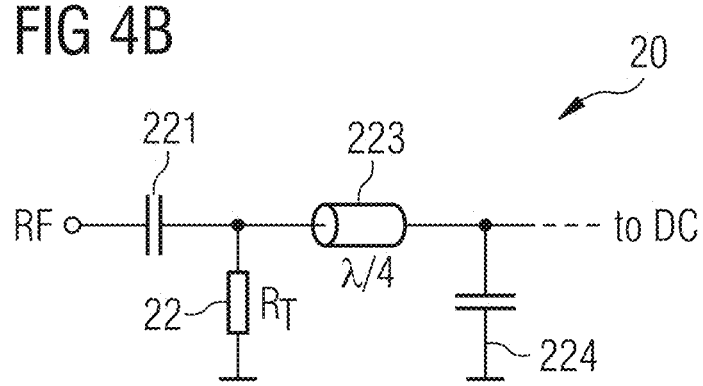
FIG. 4B illustrates an on-chip power sensor according to an exemplary embodiment of the present disclosure.

FIG. 4B shows a further embodiment of the on-chip power sensor 20 according to the disclosure. Again the RF power forwarded to the on-chip power sensor 20 enters from the left via a first capacitor 221 to the resistor 22 as before.

Further, a quarter wavelength element 223 is coupled to the resistor 22 in combination with a second capacitor 224. In such a setup a change in resistance of the resistor 22 may be detected by a DC measurement.

Figure 4C:
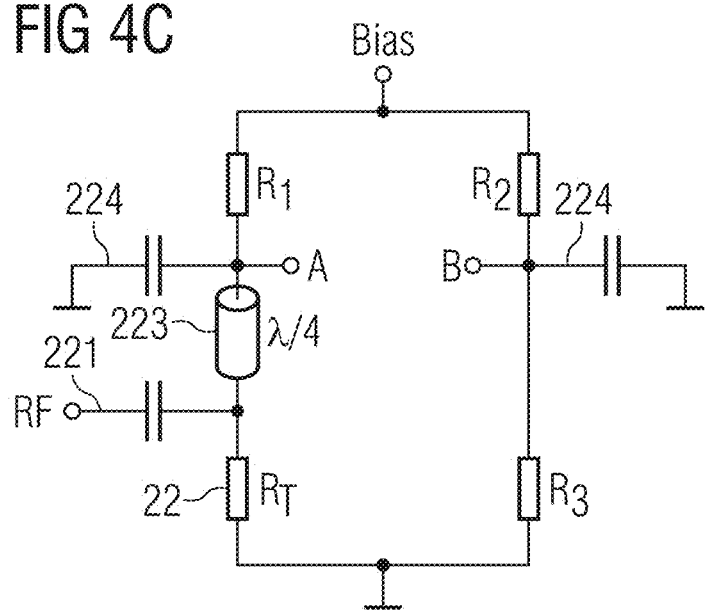
FIG. 4C illustrates an on-chip power sensor according to an exemplary embodiment of the present disclosure.

FIG. 4C shows another embodiment of the on-chip power sensor 20 according to the disclosure. The change in resistance may be measured as voltage between the terminals A and B. As before, the RF power may enter from the left via the first capacitor 221 and the temperature dependent resistor 22 together with the quarter wavelength element 223 and the second capacity 224 in combination with a non-temperature dependent resistor R1. A person of ordinary skill will appreciate that the temperature dependent resistor 22, the first capacity, the quarter wavelength element 223, the second capacity 224 and the resistor R1 may form a first branch of a balancing bridge, in FIG. 4C the left branch of the balancing bridge, which may be biased using a corresponding bias voltage at the bias terminal Bias.

A right branch of such a balancing bridge may not comprise the temperature dependent resistor 22, the first capacity, and/or the quarter wavelength element 223. The right branch may however comprise the second capacitor 224 and non-temperature dependent resistances R2 and R3. If now the temperature dependent resistor 22 is to change its resistivity due to a change in temperature caused by RF power deposited in the temperature dependent resistor 22, this will cause an imbalance of the balancing bridge between the left and right branch of the bridge as shown in FIG. 4C. This voltage between the terminals A and B gives a measure of the RF power deposited in the resistor 22 due to temperature dependency of the resistor 22.

Figure 4D:
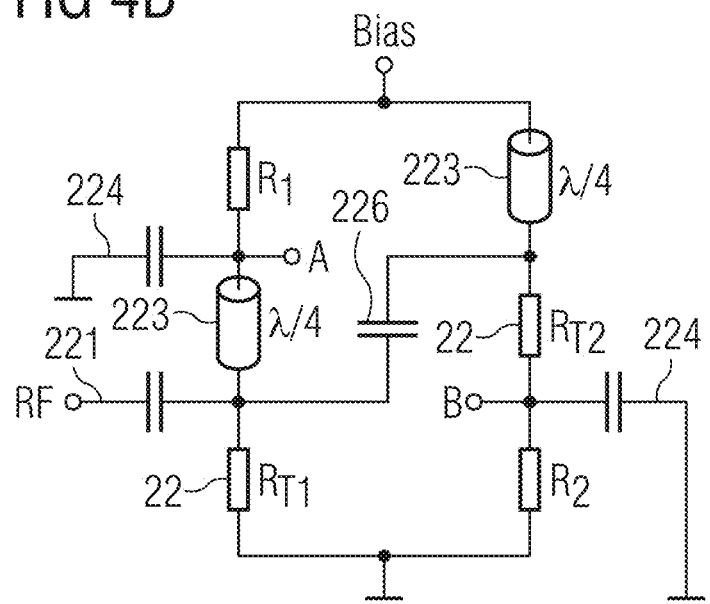
FIG. 4D illustrates an on-chip power sensor according to an exemplary embodiment of the present disclosure.

FIG. 4D shows yet another embodiment of the on-chip power sensor 20 according to the disclosure. The bridge shown in FIG. 4D is somewhat similar to the balancing bridge shown in FIG. 4C. The RF power now enters the left and the right branch of the bridge via the capacitors 221 and 226, respectively. The quarter wavelength elements 223 and the capacitors 224 form an open for RF while DC components are confronted with a standard bridge circuitry. Therefore, the RF power reaches the temperature dependent resistors 22 only. The bridge shown in FIG. 4D may be of interest in order to increase an accuracy of the bridge compared to the bridge discussed in FIG. 4C. This is due to the resistors 22 in FIG. 4D, shifting the potential at nodes A and B in opposite directions, respectively.

The temperature dependence of resistor 22 within the right branch may be identical to the one of the resistor 22 within the left branch of the bridge. The resistor R2 may however be substantially not temperature-dependent and nominally identical to R1. The further capacity 224 may be nominally identical to the capacity 224 within the left branch of FIG. 4D. If now the temperature dependent resistors R22 are to change their resistivity values, this will cause an imbalance within the bridge shown in FIG. 4D. The imbalance will be measurable as a voltage across the terminals A and B. This voltage between the terminals A and B gives a measure of the RF power deposited in the resistors 22 due to the temperature dependency of the resistors 22.

Figure 4E:
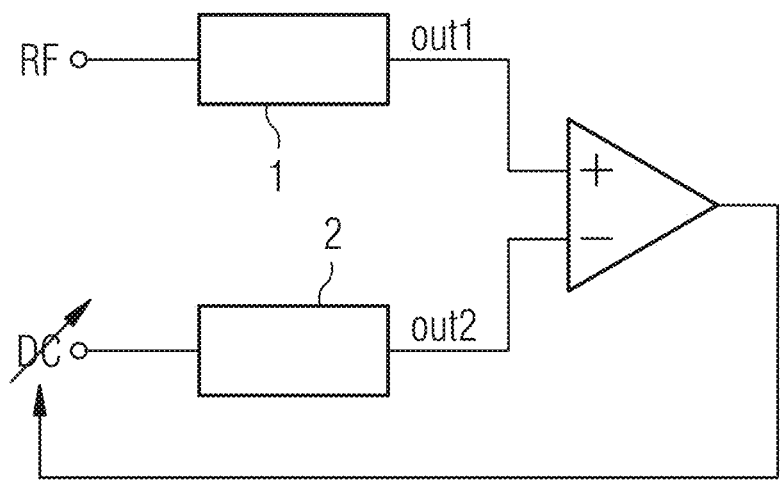
FIG. 4E illustrates an on-chip power sensor according to an exemplary embodiment of the present disclosure.

FIG. 4E shows another embodiment of an on-chip power sensor 20 wherein the elements 1 and 2 may comprise temperature dependent resistors, for example in a setup as explained in FIG. 4A, respectively. If the first element 1 receives an RF transmit power a resulting voltage will be present at its output out1. The operational amplifier downstream the elements 1 and 2 may regulate a DC voltage present at the input of the second element 2 until an output out2 of the second element 2 will provide a voltage substantially identical to the voltage present at the first output out1. This is to say that a DC power fed to the second element equals the power of the RF signal fed to the first element 1. The measurement of the DC power applied to the second element 2 is known in the art and is omitted for brevity.

The millimeter-wave transmitter 1 according to the disclosure, the method of calibrating the RF power transmitted by the millimeter-wave transmitter 1 and the implementations of the on-chip power sensor 20 were explained in some embodiments, these embodiments are to be construed as explaining examples only and in no way to limit the scope of the present disclosure. A person of ordinary skill will readily understand that individual ones of the embodiments may be combined without departing from the scope of the present disclosure. Likewise embodiments may comprise some or all of the features explained with regards to the exemplary embodiments disclosed herein.

Figure 5A:
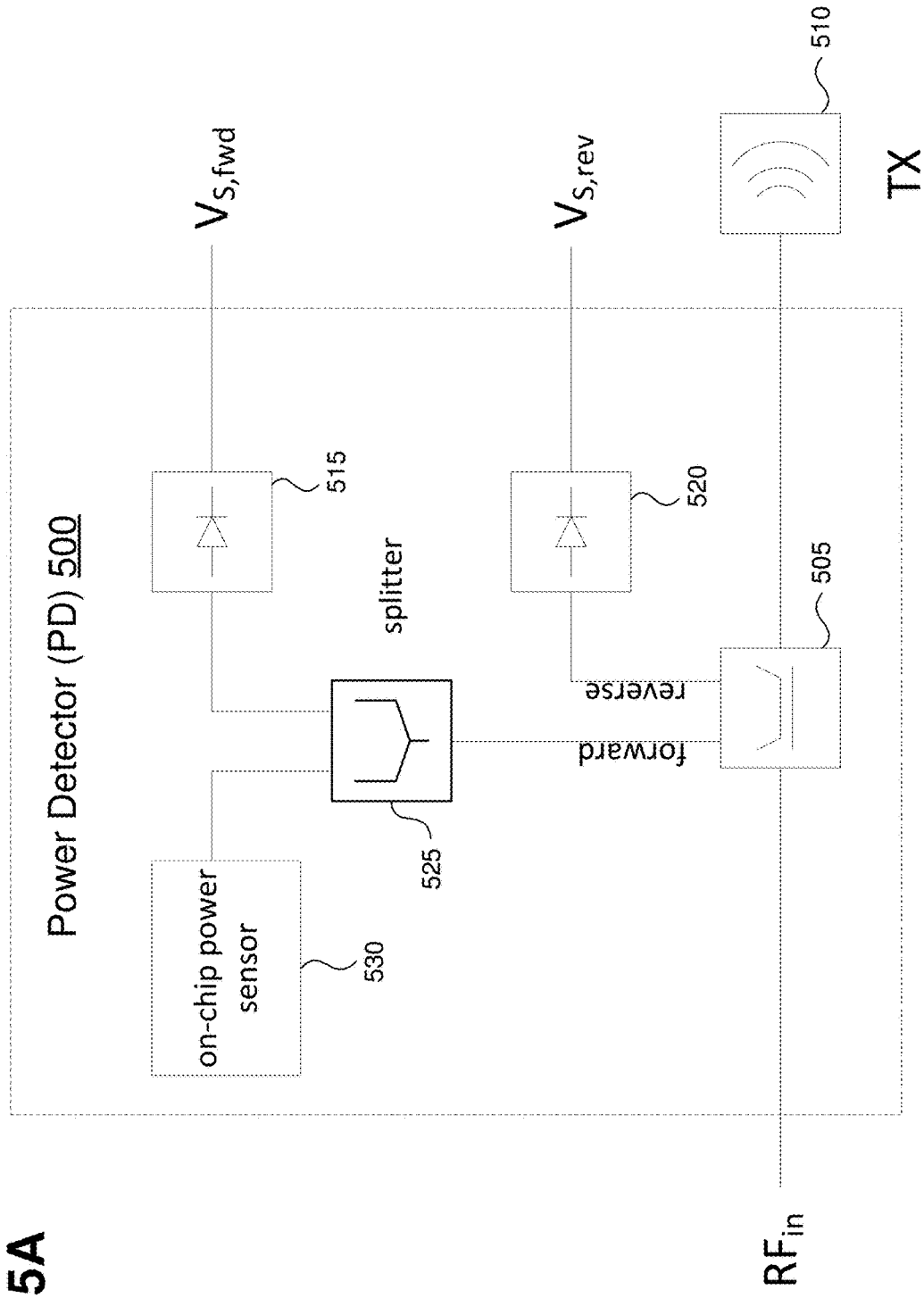
FIG. 5A illustrates a power detector according to an exemplary embodiment of the present disclosure.

FIG. 5A shows a power detector (PD) 500 according to an exemplary embodiment of the present disclosure. The power detector 500 can be implemented in, for example, a millimeter-wave transmitter.

In an exemplary embodiment, the power detector 500 includes coupler 505, power estimators 515 and 520, splitter 525, and on-chip power sensor 530. The power estimators 515 and/or 520 can be configured similar to (or identical to) the power estimators 16 described above. The power estimator 520 can be configured to estimate the RF power of a received signal (e.g., $V_{S,rev}$) that is received via antenna 510. The power estimator 515 can be configured to estimate the RF power of the transmitted RF input signal (e.g., $V_{S,fwd}$). The received signal can represent signals received when the transmitter is operating as a transceiver, or when the transmitter is configured as a transmitter only. For example, the received signal may be reflected power resulting from, for example, when the channel is not ideally matched to one or more succeeding stages.

The coupler 505 can be configured to receive a RF input (e.g., $RF_{in}$) and to couple a defined amount of the RF input to a forward port connected to the splitter 525. The coupler can be, for example, a directional coupler or another passive or active device as would be understood by one of ordinary skill in the art. The coupler 505 can be configured to provide the received RF input to, for example, an antenna 510. As would be understood by those skilled in the art, the electromagnetic power provided to the antenna is less than the RF input supplied to the coupler 505 as the coupler couples a portion of the RF input to the splitter 525. In an exemplary embodiment, the coupler 505 can be multidirectional and can couple electromagnetic power received via the antenna 510 to a reverse port connected to the power estimator 520, which can be configured to estimate the RF power of the received signal (e.g., $V_{S,rev}$). The received signal can represent a reflected power resulting from, for example, when the channel is not ideally matched to one or more succeeding stages. In this example, the channel may operate as a transmitter only or a transceiver (i.e., both transmitting and receiving).

The splitter 525 is configured to receive the coupled output (via the forward port) from the coupler 505 and to split the coupled output between two or more components. For example, the splitter 525 can be a 1:2 splitter that splits the coupled output between the on-chip power sensor 530 and the power estimator 515. The splitter 525 is not limited to a 1:2 splitter can be a N:M splitter, where N and M are positive integers. The splitter 525 can be implemented as a power divider, a power splitter, a Wilkinson power splitter, hybrid coupler, hybrid ring coupler, a circulator, also known as a rat race coupler, a directional coupler, or other splitter technology as would be understood by one of ordinary skill in the art. In an exemplary embodiment, the splitter 525 may alternatively or additionally make use of a capacitive coupling. The splitter 525 can be an embodiment of the power splitter 14 illustrated in FIG. 2A. In an exemplary embodiment, the splitter 535 includes one or more circuits configured to split one or more inputs to two or more outputs.

The splitter 525 may split the forward transmit power provided via the coupler 505 between the on-chip power sensor 530 and the power estimator 515. In an exemplary embodiment, the splitter 525 may split the forward transmit power equally between the on-chip power sensor 530 and the power estimator 515, but is not limited to this splitting ratio.

In an exemplary embodiment, the on-chip power sensor 530 is configured to measure the power of electromagnetic radiation. In an exemplary embodiment, the on-chip power sensor 530 is configured to measure the power of electromagnetic radiation based on a temperature-dependent electrical resistance. In an exemplary embodiment, the on-chip power sensor 530 includes one or more circuits and/or logic components configured to perform one or more operations and/or functions of the on-chip power sensor 530, including, for example, measure the power of electromagnetic radiation, which can include the power of electromagnetic radiation based on a temperature-dependent electrical resistance. In an exemplary embodiment, the on-chip power sensor 530 includes processor circuitry configured to perform one or more operations and/or functions of the on-chip power sensor 530.

As a non-limiting example, the on-chip power sensor 530 can be bolometer. In an exemplary operation, the temperature of the on-chip power sensor 530 is changed (e.g., increased) in the presence of electromagnetic radiation (e.g., the RF input). The change in resistance of the on-chip power sensor 530 is dependent on temperature, and therefore will change based on the RF-induced temperature change. The change in resistance can be used to measure the power of the electromagnetic radiation. The resistance can be detected using a direct current (DC) measurement. For example, a DC voltage can be applied across the resistive element of the on-chip power sensor 530 to determine the voltage drop across the resistive element. This resistance can then be determined based on the voltage drop. In applying the DC measurement, the voltage can be selected to be a small voltage value so as to not result in a significant temperature change of the on-chip power sensor 530. In an exemplary embodiment, the DC voltage value is a minimum voltage in which a voltage drop across the resistive element of the on-chip power sensor 530 can be measured.

In the exemplary embodiments illustrated in FIG. 5A, the on-chip power sensor 530 can be implemented in a millimeter-wave transmitter by coupling to the transmission path (path from RF input to antenna 510). In this configuration, an additional calibration channel is not needed (as in the embodiments illustrated in FIGS. 2A-2B) for the RF measurement using the on-chip power sensor 530.

In an exemplary embodiment, the on-chip power sensor 530 is configured to measure the power of electromagnetic radiation with a higher accuracy compared to the power estimators 515 and 520.

Figure 5B:
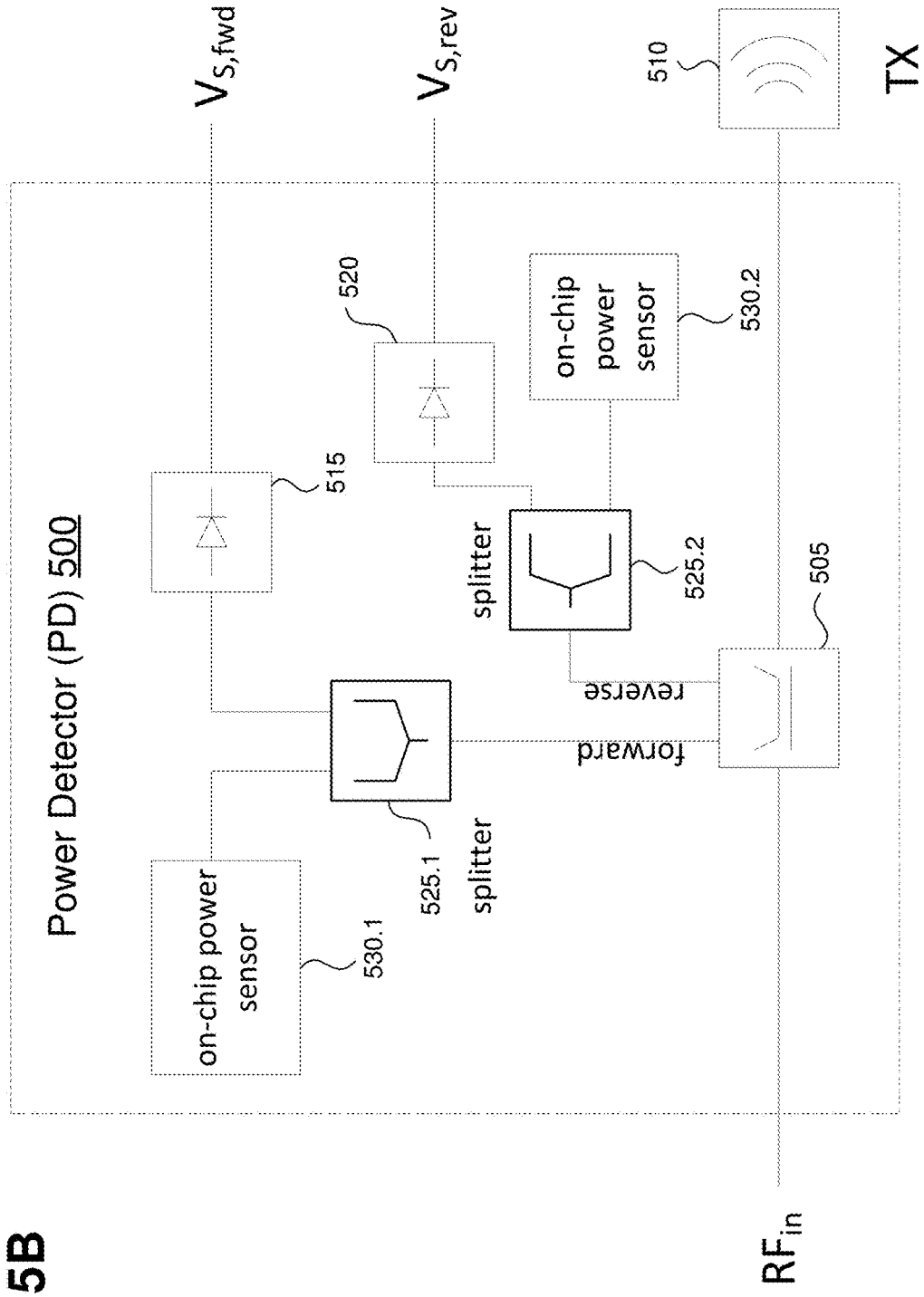
FIG. 5B illustrates a power detector according to an exemplary embodiment of the present disclosure.

With reference to FIG. 5B, the power detector 500 according to an exemplary embodiment can include a similar splitter and on-chip power sensor configuration on the reverse path. For example, the power detector 500 can include a first splitter 525.1 on the forward path that splits the connection from the coupler 505 to a first on-chip power sensor 530.1 and power estimator 515, and a second splitter 525.2 on the reverse path that splits the connection from the coupler 505 to a second on-chip power sensor 530.2 and power estimator 520. In this example, the on-chip power sensors 530.1 and 530.2 and/or the splitters 525.1 and 525.2 can be similarly or differently configured, respectively.

Figure 6A:
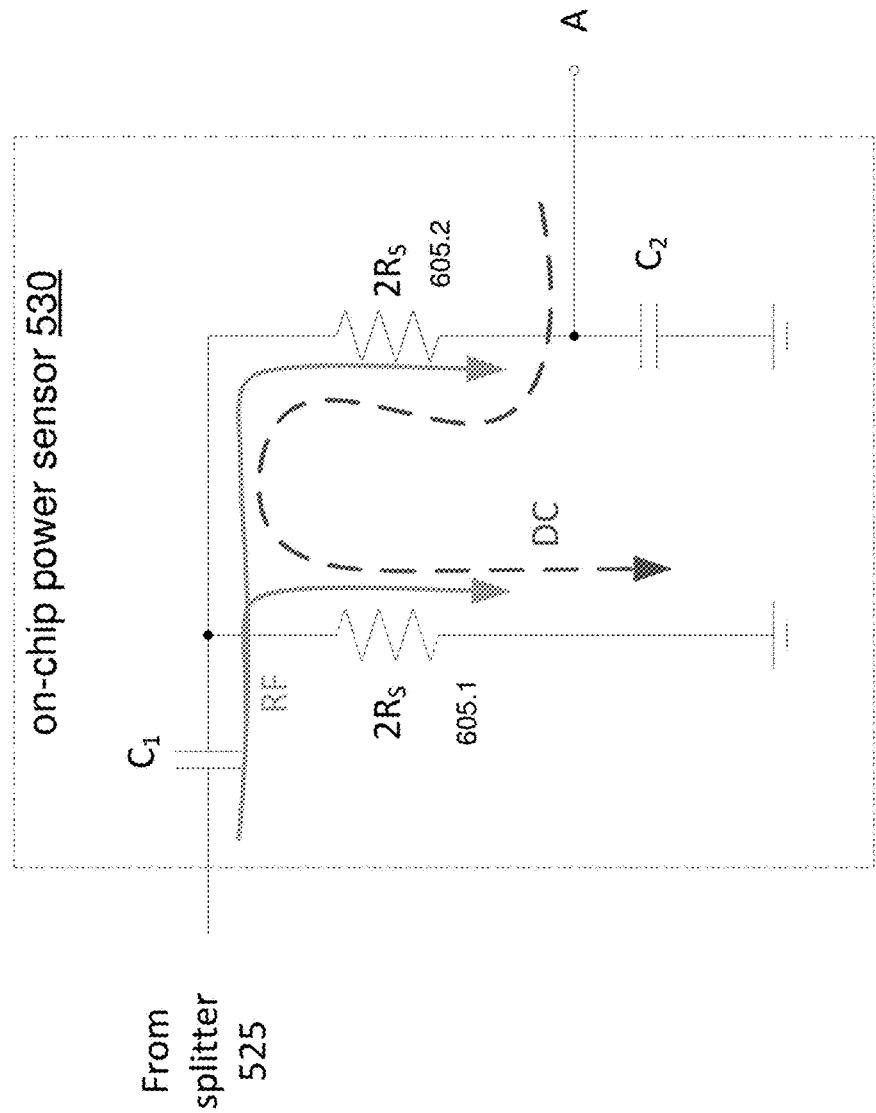
FIG. 6A illustrates an on-chip power sensor according to an exemplary embodiment of the present disclosure.

FIG. 6A illustrates an exemplary embodiment of the on-chip power sensor 530. The on-chip power sensor 530 can include a split bolometer configuration configured to separate an RF signal (e.g., RF input signal from splitter 525) and a DC signal supplied via Port A to measure the resistance of the on-chip power sensor 530 (e.g., resistance of resistors $2R_S$).

In an exemplary embodiment, the on-chip power sensor 530 includes a two resistors 605.1 and 605.2 connected in parallel that are connected to the splitter 525 via a capacitor $C_1$. The opposite end of the resistors 605.1 and 605.2 is connected to ground, where the resistor 605.2 is connected to ground via a capacitor $C_2$. The capacitors $C_1$ and $C_2$ can have the same or different capacitances.

In operations, the DC signal is supplied via Port A connected between the resistor 605.2 and the capacitor $C_2$. The DC signal flows from resistor 605.2 through resistor 605.1 to ground, and is indicated by the dashed line labeled "DC." In this configuration, the DC signal is blocked by capacitors $C_1$ and $C_2$. The RF signal supplied via the splitter 525 flows through resistors 605.1 and 605.2 to ground, and is indicated by the solid signal labeled "RF." As a non-limiting example, the resistors 605.1 and 605.2 have the same resistance value $2R_S$ so the RF signal is equally divided between the two parallel resistive branches as the RF signal flows to ground.

Figure 6B:
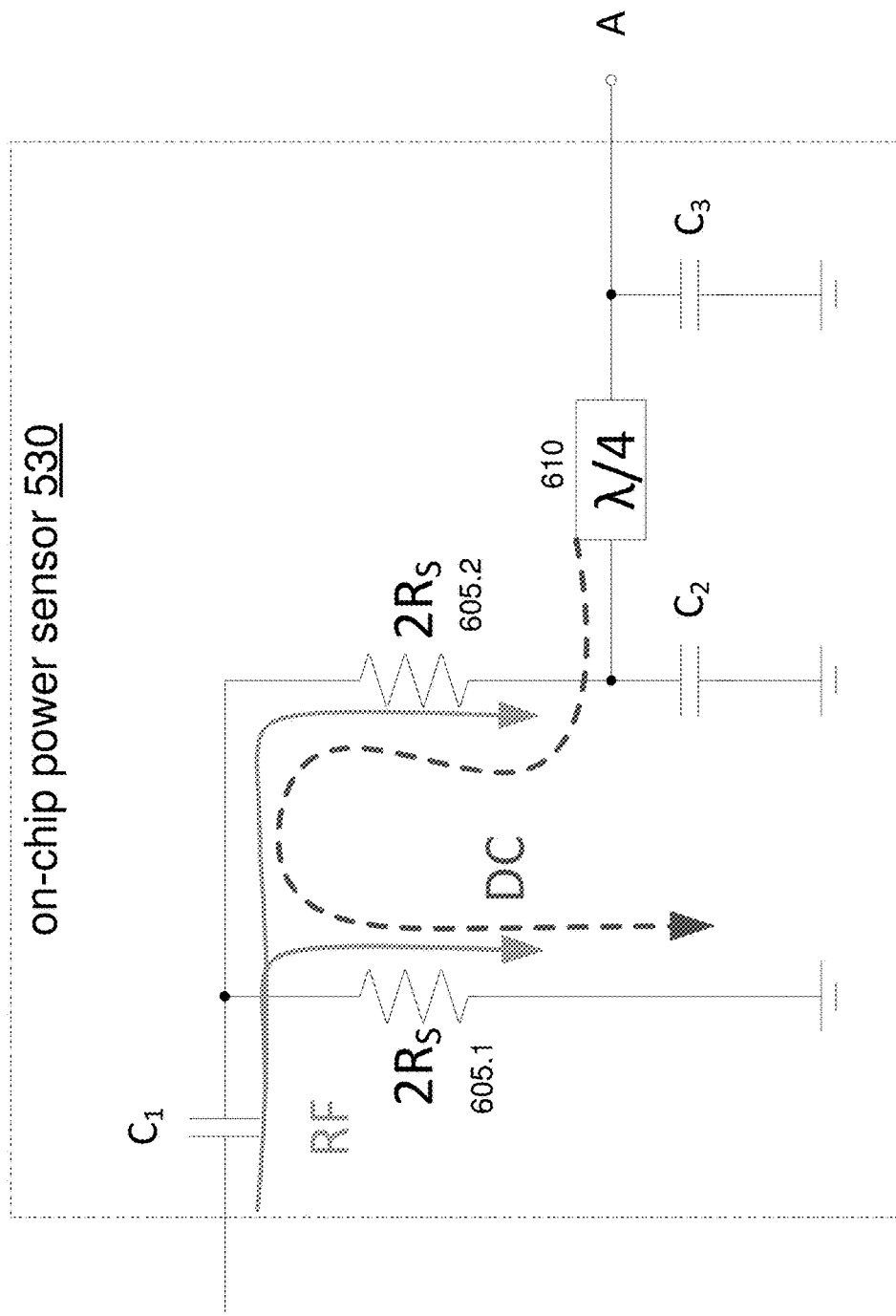
FIG. 6B illustrates an on-chip power sensor according to an exemplary embodiment of the present disclosure.

FIG. 6B illustrates an exemplary embodiment of the on-chip power sensor 530. The embodiment illustrated in FIG. 6B is similar to the embodiment illustrated in FIG. 6A, but includes a quarter-wavelength element 610 and an additional capacitor $C_3$. The capacitors $C_1$, $C_2$, and $C_3$ can have the same or different capacitances.

The quarter wavelength element 610 can be, for example, a transmission line or waveguide having a length that is one-quarter wavelength ($\lambda/4$) long, or another quarter-wavelength impedance transformer as would be understood by one of ordinary skill in the art. In an exemplary embodiment, a first end of the quarter-wavelength element 610 is connected to a node between resistor 605.2 and capacitor $C_2$. The second end of the quarter-wavelength element 610 is connected to Port A. The capacitor $C_3$ is connected between the second end of the quarter-wavelength element 610 and ground. Similar to the embodiment illustrated in FIG. 6A, the DC signal is supplied via Port A. The DC signal flows through the quarter-wavelength element 610 and then through the resistor 605.2 and resistor 605.1 to ground, and is again indicated by the dashed line labeled "DC." In this configuration, the DC signal is blocked by capacitors $C_1$, $C_2$, and $C_3$. The RF signal supplied via the splitter 525 flows through resistors 605.1 and 605.2 to ground, and is indicated by the solid signal labeled "RF." Here, the capacitors $C_1$, $C_2$, and $C_3$ block the DC signal but act as a short with respect to the RF signal.

Figure 6C:
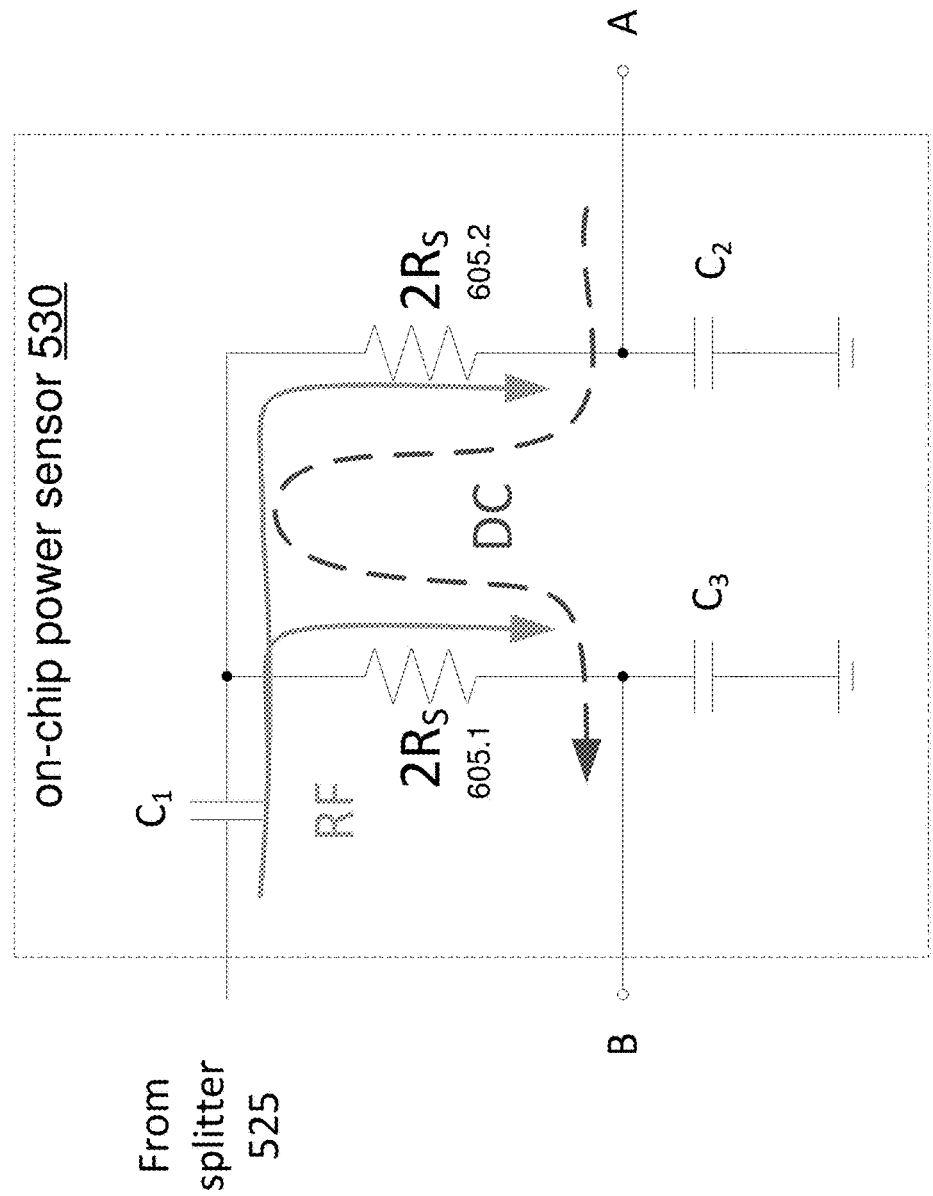
FIG. 6C illustrates an on-chip power sensor according to an exemplary embodiment of the present disclosure.

FIG. 6C illustrates an exemplary embodiment of the on-chip power sensor 530. The on-chip power sensor 530 can include a split bolometer configuration configured to separate an RF signal (e.g., RF input signal from splitter 525) and a DC signal supplied via Port A to measure the resistance of the on-chip power sensor 530 (e.g., resistance of resistors $2R_S$).

The embodiment illustrated in FIG. 6C is similar to the embodiment illustrated in FIG. 6A, but includes an additional capacitor $C_3$ connected between the resistor 605.1 and ground. The additional capacitor $C_3$ increases the symmetry of the circuit decouples the resistance measurement via Ports A & B from possible common ground potential. The capacitors $C_1$, $C_2$, and $C_3$ can have the same or different capacitances.

Figure 6D:
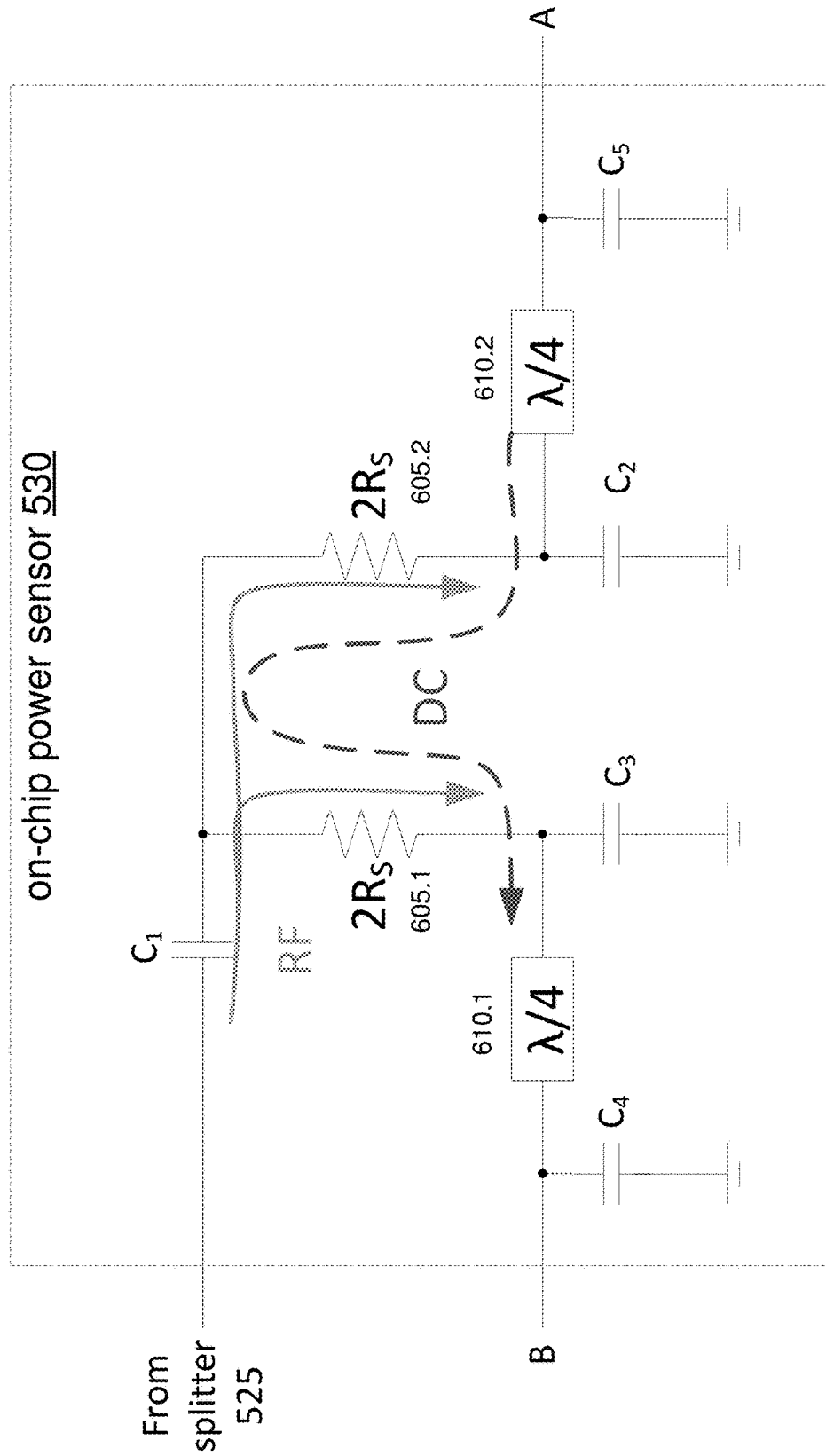
FIG. 6D illustrates an on-chip power sensor according to an exemplary embodiment of the present disclosure.

FIG. 6D illustrates an exemplary embodiment of the on-chip power sensor 530. The embodiment illustrated in FIG. 6D is similar to the embodiment illustrated in FIG. 6C, but includes quarter-wavelength elements 610.1 and 610.2, and additional capacitors $C_4$ and $C_5$ similar to the embodiment illustrated in FIG. 6B. The capacitors $C_1$, $C_2$, $C_3$, $C_4$, and $C_5$ can have the same or different capacitances.

The quarter-wavelength elements 610.1 and 610.2 can be the same or different, and can include, for example, a transmission line or waveguide having a length that is one-quarter wavelength ($\lambda/4$) long, or another quarter-wavelength impedance transformer as would be understood by one of ordinary skill in the art. In this example, DC signal flows from Port A to Port B through quarter-wavelength elements 610.2, resistor 605.2, resistor 605.1, and quarter-wavelength elements 610.1. The resistance measurement is taken via Ports A & B.

Figure 7A:
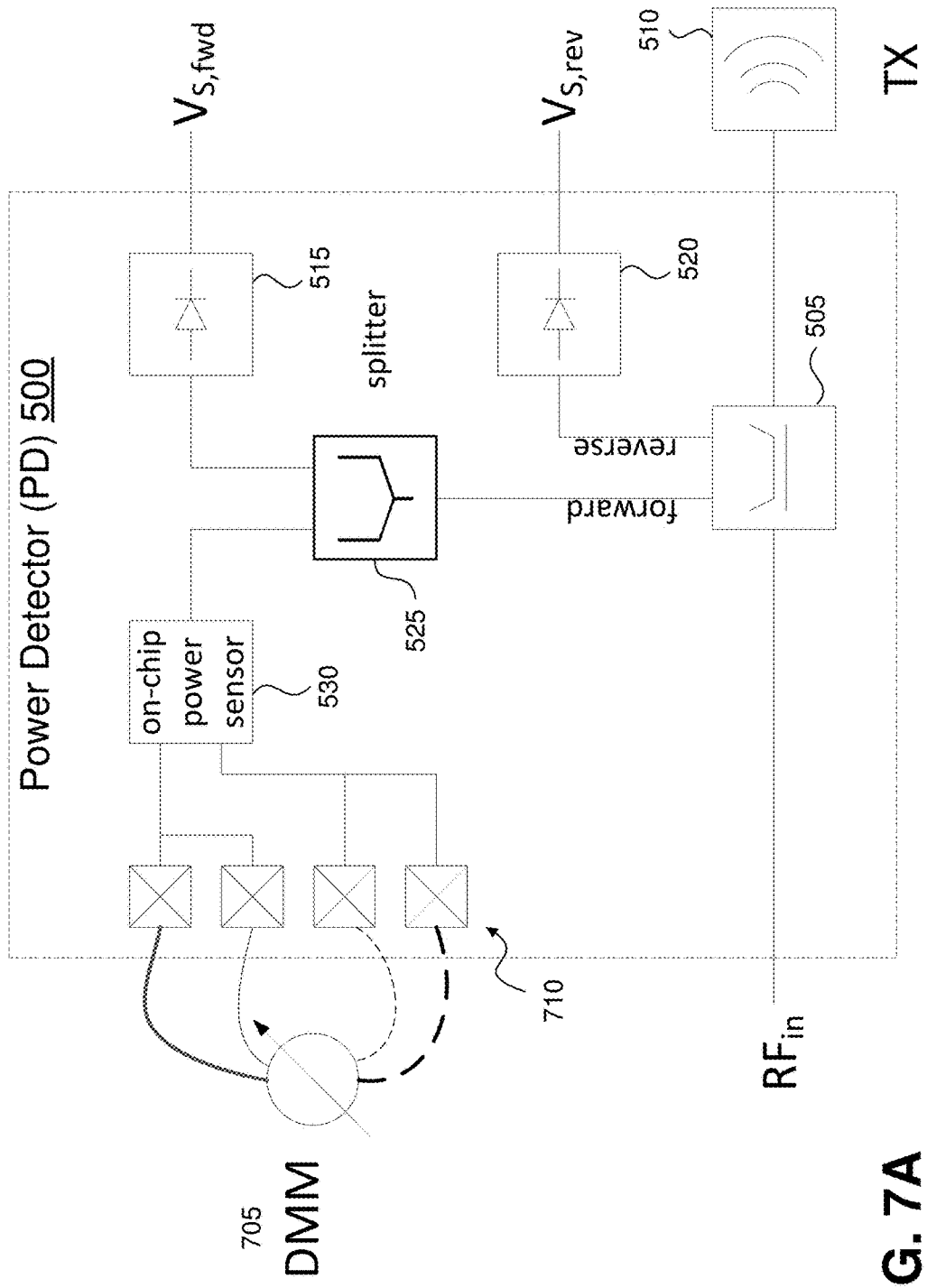
FIG. 7A illustrates a power detector according to an exemplary embodiment of the present disclosure.

FIG. 7A illustrates an exemplary embodiment of the power detector 500. The power detector 500 can be implemented with an external digital multi-meter (DMM) 705 that is configured to perform the DC measurement of the on-chip power sensor 530 as illustrated in FIGS. 6A-6D. The DMM 705 can be configured to connect to the on-chip power sensor 530 via pads 710. In an exemplary embodiment, the DMM 705 is configured to perform a four-wire resistance measurement and includes four wires connected to four pads 710. In this example, the four wires include two sets of force-sense pairs. The DMM 705 can be configured to supply the DC signal to the on-chip power sensor 530 to measure the resistance of the on-chip power sensor 530 (e.g., resistors 605).

Figure 7B:
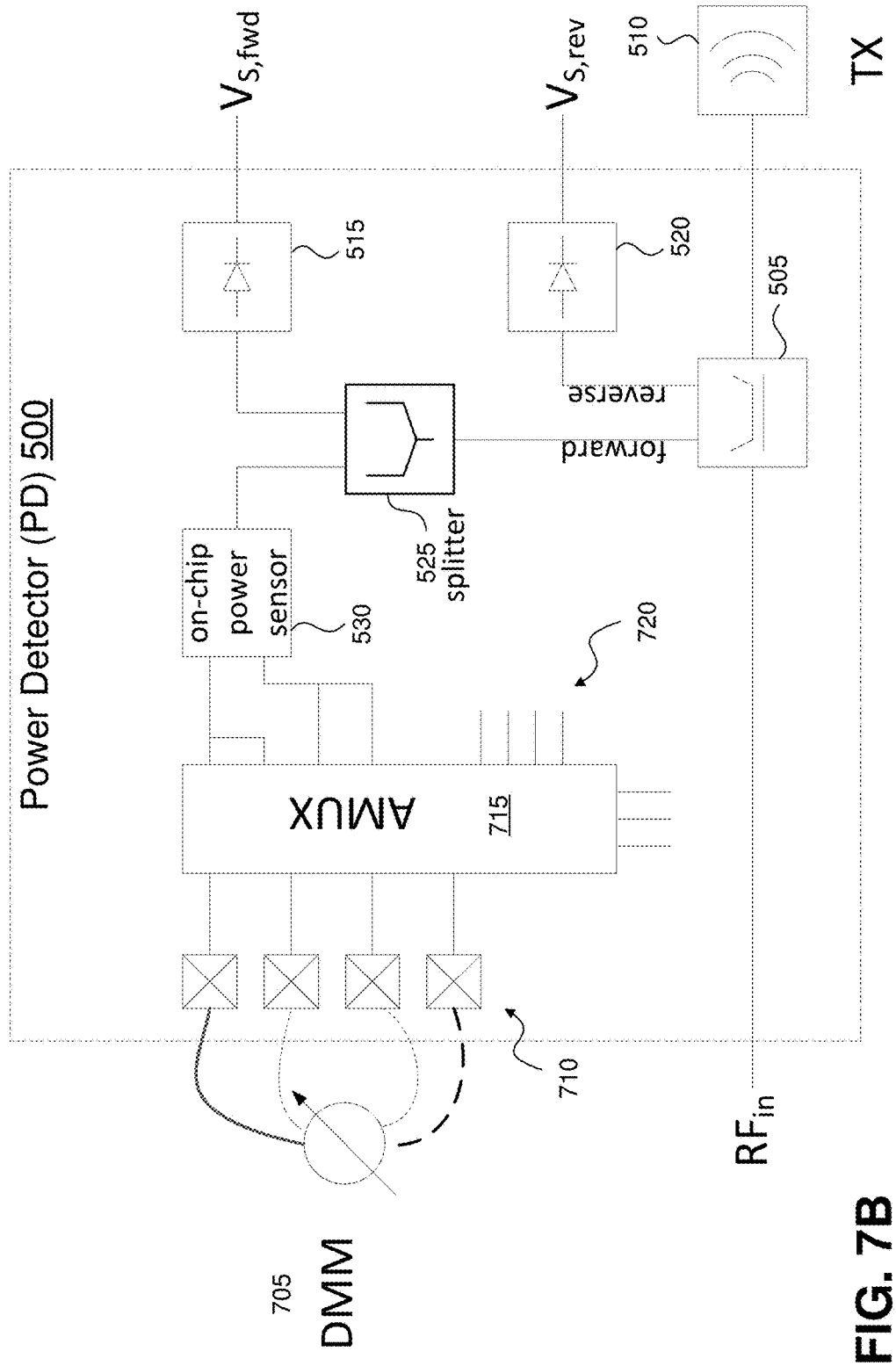
FIG. 7B illustrates a power detector according to an exemplary embodiment of the present disclosure.

FIG. 7B illustrates an exemplary embodiment of the power detector 500. In an exemplary embodiment, power detector 500 includes an integrated analog multiplexer (AMUX) 715, and the power detector 500 is connected with the external digital multi-meter (DMM) 705 via the AMUX 715. The AMUX 715 can include additional inputs 720 that can be connected to other sensors within the power detector to allow the DMM 705 to measure one or more other types of information of the power detector 500, including, for example, temperature of the power detector 500 via one or more temperature sensors. The AMUX 715 can be configured to multiplex one or more of the inputs 720 and the connections with the on-chip power sensor 530 to the DMM 705.

Figure 7C:
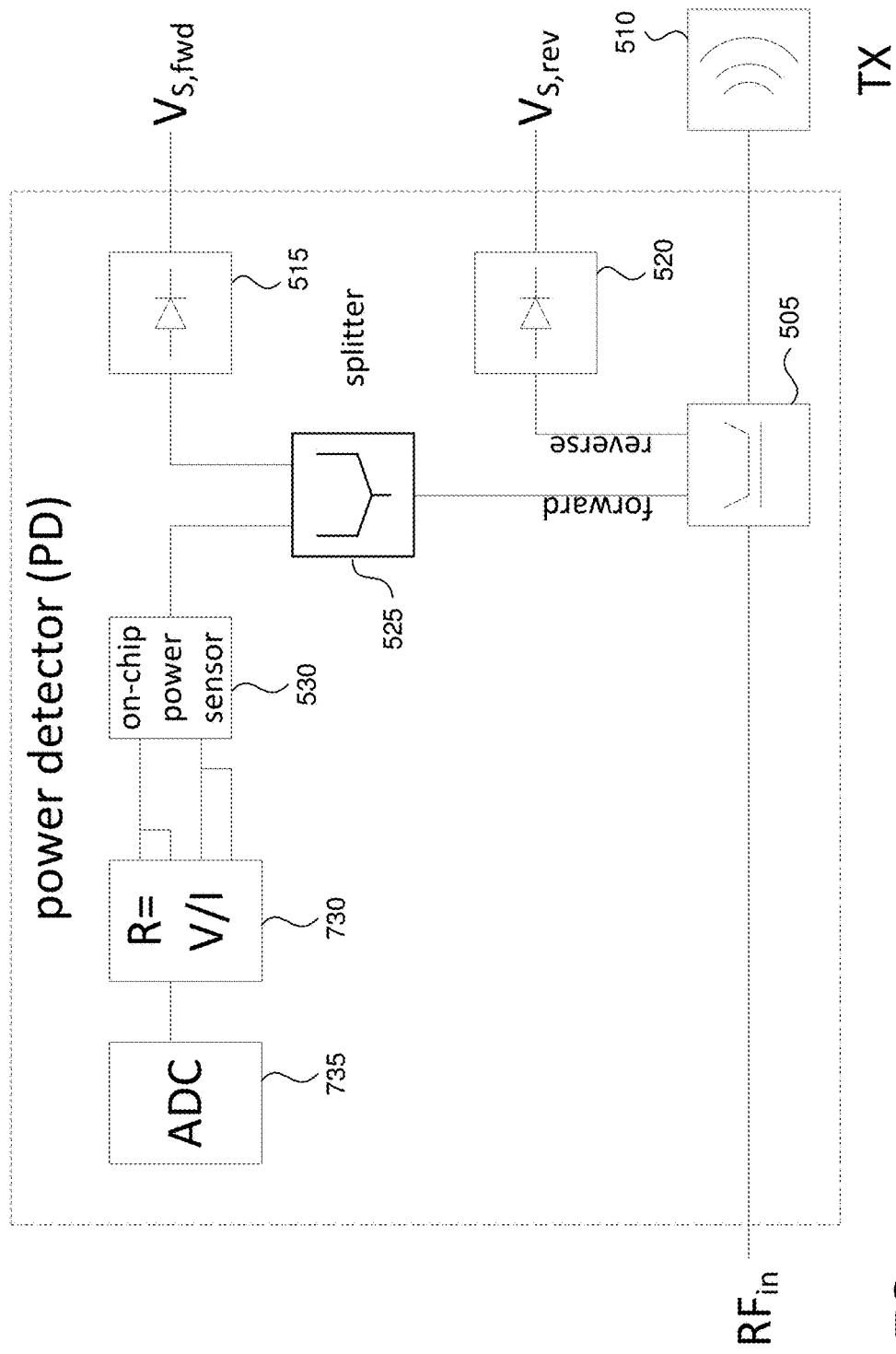
FIG. 7C illustrates a power detector according to an exemplary embodiment of the present disclosure.

FIG. 7C illustrates an exemplary embodiment of the power detector 500. In an exemplary embodiment, power detector 500 includes a voltage-current ratio calculator circuit 730 that is configured to calculate a voltage-to-current (V/I) ratio based on one or more signals from the on-chip power sensor 530. The voltage-current ratio calculator circuit 730 can generate a signal that is proportional to the resistance to analog-to-digital converter (ADC) 735 to generate a digital signal corresponding to the resistance of the on-chip power sensor 530.

Conclusion

The aforementioned description of the specific embodiments will so fully reveal the general nature of the disclosure that others can, by applying knowledge within the skill of the art, readily modify and/or adapt for various applications such specific embodiments, without undue experimentation, and without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general purpose computer.

For the purposes of this discussion, the term "processor circuitry" shall be understood to be circuit(s), processor(s), logic, or a combination thereof. For example, a circuit can include an analog circuit, a digital circuit, state machine logic, other structural electronic hardware, or a combination thereof. A processor can include a microprocessor, a digital signal processor (DSP), or other hardware processor. The processor can be "hard-coded" with instructions to perform corresponding function(s) according to embodiments described herein. Alternatively, the processor can access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, processor circuitry can include memory that stores data and/or instructions. The memory can be any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

REFERENCE LIST

A, B port
1. Millimeter-wave transmitter
10 Oscillator
11A, 11B at least one transmit path
11C Calibration path
12A, 12B, 12C Amplifier
14 Power splitter
16A, 16B, 16C Power estimator
18 On-chip termination
19A, 19B, 19C Antenna element
20 On-chip Power sensor
221 First capacity
223 Quarter wavelength element
22 Temperature dependent resistor
224 Second capacity
226 Bridging capacity
505 coupler
510 antenna
515, 520 power estimator
525 splitter
530 on-chip power sensor
605 resistor
610 Quarter wavelength element
705 digital multi-meter (DMM)
710 pad
715 analog multiplexer (AMUX)
720 inputs
730 voltage-current ratio calculator circuit
735 analog-to-digital converter (ADC)

What is claimed is:

1. A millimeter-wave communication device on a chip, comprising:
a coupler disposed on a transmit path, the coupler being configured to receive a transmit signal and to provide the transmit signal to an antenna connection; and
an on-chip power sensor that includes a resistor formed on a layer within the chip, the layer being configured to implement at least one transistor within the chip, wherein the on-chip power sensor is configured to:
receive a coupled portion of the transmit signal from the coupler, and
measure a transmit power of the transmit signal based on the coupled portion of the transmit signal.

2. The millimeter-wave communication device according to claim 1, further comprising:
a power estimator configured to estimate the transmit power of the transmit signal; and
a splitter configured to receive the coupled portion of the transmit signal and to split the coupled portion of the transmit signal between the power estimator and the on-chip power sensor.

3. The millimeter-wave communication device according to claim 1, wherein the layer is a silicide polysilicon layer used to connect the at least one transistor within the chip.

4. The millimeter-wave communication device according to claim 1, wherein the resistor is a temperature dependent resistor.

5. The millimeter-wave communication device according to claim 2, wherein:
the power estimator comprises a diode configured to produce a voltage based on the transmit power of a first portion of the coupled portion of the transmit signal provided to the power estimator by the splitter; and
the on-chip power sensor comprises a resistor whose resistance changes based on a temperature of the resistor, the temperature of resistor being dependent on the transmit power of a second portion of the coupled portion of the transmit signal provided to the on-chip power sensor by the splitter.

6. The millimeter-wave communication device according to claim 1, wherein the on-chip power sensor is configured to measure the transmit power of the transmit signal based on a change of resistance of the on-chip power sensor.

7. The millimeter-wave communication device according to claim 6, wherein the change of resistance is dependent on a transmit signal induced temperature change of the on-chip power sensor.

8. The millimeter-wave communication device according to claim 1, further comprising an oscillator configured to generate the transmit signal.

9. The millimeter-wave communication device according to claim 1, further comprising a second on-chip power sensor that is configured to:
receive a received signal via the antenna connection; and
measure a radio frequency (RF) power of the received signal, wherein the coupler is further configured to receive the received signal from the antenna connection and to provide the received signal to the second on-chip power sensor.

10. The millimeter-wave communication device according to claim 9, further comprising a power estimator configured to estimate the transmit power of the transmit signal.

11. The millimeter-wave communication device according to claim 10, wherein:
the power estimator comprises a diode configured to produce a voltage based on the transmit power of the transmit signal; and
the on-chip power sensor and/or the second on-chip power sensor comprises a resistor whose resistance changes based on a temperature of the resistor.

12. The millimeter-wave communication device according to claim 10, further comprising a second power estimator configured to receive the received signal via the antenna connection and to estimate a RF power of the received signal.

13. The millimeter-wave communication device according to claim 1, wherein the on-chip power sensor comprises:
a first capacitor having a first terminal connected to the coupler;
a first resistor connected between a second terminal of the first capacitor and ground; and
a second resistor connected in series with a second capacitor, the second resistor having a first terminal connected to the second terminal of the first capacitor and a second terminal connected to a first terminal of the second capacitor, wherein a second terminal of the second capacitor is connected to ground such that the second resistor and the second capacitor are connected in parallel with first resistor.

14. The millimeter-wave communication device according to claim 1, wherein the on-chip power sensor comprises:

a first capacitor having a first terminal connected to the coupler;

a first resistor connected in series with a second capacitor, the first resistor being connected to a second terminal of the first capacitor, and the second capacitor being connected between the first resistor and ground; and a second resistor connected in series with a third capacitor, the second resistor being connected to the second terminal of the first capacitor, and the third capacitor being connected between the second resistor and ground, wherein the second resistor and the third capacitor are connected in parallel with the first resistor and the second capacitor.

15. The millimeter-wave communication device according to claim 1, further comprising an antenna coupled to the transmit path via the antenna connection.

16. A millimeter-wave communication device comprising:

a coupler disposed on a signal path, the coupler being configured to: receive a transmit signal via the signal path, receive a received signal from an antenna connection of the signal path, generate a coupled portion of the transmit signal, provide the transmit signal to the antenna connection of signal path, and generate a coupled portion of the received signal;

a first power estimator configured to estimate a transmit power of the signal based on a first portion of the coupled portion of the transmit signal;

a second power estimator configured to estimate a radio frequency (RF) power of the received signal based on a first portion of the coupled portion of the received signal;

a first on-chip power sensor configured to measure the transmit power of the transmit signal based on a second portion of the coupled portion of the transmit signal; and a second on-chip power sensor that is configured to measure the RF power of the received signal based on a second portion of the coupled portion of the received signal.

17. The millimeter-wave communication device according to claim 16, further comprising a splitter configured to receive the coupled portion of the transmit signal and to split the coupled portion of the transmit signal to generate a first coupled the first portion of the coupled portion of the transmit signal and the second portion of the coupled portion of the transmit signal.

18. The millimeter-wave communication device according to claim 17, further comprising a second splitter configured to receive the coupled portion of the received signal and to split the coupled portion of the received signal to generate the first portion of the coupled portion of the received signal and the second portion of the coupled portion of the received signal.

19. A millimeter-wave communication device on a chip, comprising:

a coupler disposed on a transmit path, the coupler being configured to receive a signal and to provide the signal to an antenna connection; and an on-chip power sensor configured to:

receive a coupled portion of the signal from the coupler, and measure a transmit power of the signal based on the coupled portion of the signal, wherein:

(a) the on-chip power sensor comprises:

a first capacitor having a first terminal connected to the coupler;

a first resistor connected between a second terminal of the first capacitor and ground; and a second resistor connected in series with a second capacitor, the second resistor having a first terminal connected to the second terminal of the first capacitor and a second terminal connected to a first terminal of the second capacitor, wherein a second terminal of the second capacitor is connected to ground such that the second resistor and the second capacitor are connected in parallel with first resistor; or (b) the on-chip power sensor comprises:

a first capacitor having a first terminal connected to the coupler;

a first resistor connected in series with a second capacitor, the first resistor being connected to a second terminal of the first capacitor, and the second capacitor being connected between the first resistor and ground; and a second resistor connected in series with a third capacitor, the second resistor being connected to the second terminal of the first capacitor, and the third capacitor being connected between the second resistor and ground, wherein the second resistor and the third capacitor are connected in parallel with the first resistor and the second capacitor.

* * * * *